(12) United States Patent
Powell et al.

(10) Patent No.: US 7,399,572 B2
(45) Date of Patent: Jul. 15, 2008

(54) PRETREATMENT COMPOSITIONS

(75) Inventors: David B. Powell, Minnetonka, MN (US); Ahmad A. Naiini, East Greenwich, RI (US); N. Jon Metivier, Billerica, MA (US); Il'ya Rushkin, Billerica, MA (US); Richard Hopla, Cranston, RI (US)

(73) Assignee: Fujifilm Electronic Materials U.S.A., Inc., North Kingstown, RI (US)

( * ) Notice: Subject to any disclaimer, the term of this patent is extended or adjusted under 35 U.S.C. 154(b) by 30 days.

(21) Appl. No.: 11/445,902

(22) Filed: Jun. 2, 2006

(65) Prior Publication Data

US 2006/0286484 A1 Dec. 21, 2006

Related U.S. Application Data

(60) Provisional application No. 60/687,433, filed on Jun. 3, 2005.

(51) Int. Cl.
*G03F 7/023* (2006.01)
*G03F 7/038* (2006.01)
*C23C 22/52* (2006.01)
*C23C 22/63* (2006.01)

(52) U.S. Cl. ................... 430/270.1; 430/311; 430/326; 430/330

(58) Field of Classification Search ................. 430/190, 430/191, 192, 193, 270.1, 271.1, 273.1, 276.1, 430/283.1, 326, 330; 106/14.05, 14.41, 14.45
See application file for complete search history.

(56) References Cited

U.S. PATENT DOCUMENTS

| | | | |
|---|---|---|---|
| 3,645,772 A | 2/1972 | Jones | 117/34 |
| 3,873,316 A | 3/1975 | Velten et al. | 96/75 |
| 4,645,714 A * | 2/1987 | Roche et al. | 428/458 |
| 5,214,116 A | 5/1993 | Matsuoka et al. | 526/286 |
| 5,434,031 A | 7/1995 | Nakao et al. | 430/191 |
| 5,439,747 A * | 8/1995 | Sturdevant et al. | 428/447 |
| 5,496,590 A | 3/1996 | Maki et al. | 427/388.1 |
| 6,001,517 A | 12/1999 | Kawamonzen | 430/18 |
| 6,177,225 B1 | 1/2001 | Weber et al. | 430/190 |
| 6,214,516 B1 | 4/2001 | Waterson et al. | 430/191 |
| 6,576,381 B1 * | 6/2003 | Hirano et al. | 430/11 |
| 2004/0058232 A1 * | 3/2004 | Kim et al. | 429/137 |
| 2004/0249110 A1 | 12/2004 | Naiini et al. | 528/173 |
| 2004/0253537 A1 * | 12/2004 | Rushkin et al. | 430/270.1 |
| 2004/0253542 A1 * | 12/2004 | Rushkin et al. | 430/281.1 |
| 2005/0037413 A1 | 2/2005 | Park et al. | 435/6 |
| 2005/0096405 A1 * | 5/2005 | Kamen | 522/1 |

FOREIGN PATENT DOCUMENTS

JP 09325480 12/1997

OTHER PUBLICATIONS

Studies of polyimide/copper interface and its improvement by a two-component primer, Dong, Jian, et al. Department Polymer Science and Engineering, Nanjing University, Nanjing, 210093, Peop. Rep. China, Huethig & Wepf, pp. 143-157, 1995.
The formation of an effective anti-corrosion film on copper surfaces from 2-mercaptobenzimidazole solution, Xue, Gi et al., Dep. Chem., Nanjing Univ., Nanjing, 210008, Peop. Rep. China, Journal of Electroanalytical Chemistry and Interfacial Electrochemistry, pp. 139-148, 1991.
International Search Report dated Dec. 26, 2006.

* cited by examiner

*Primary Examiner*—Cynthia H. Kelly
*Assistant Examiner*—Anca Eoff
(74) *Attorney, Agent, or Firm*—Fish & Richardson P.C.

(57) ABSTRACT

A pretreatment composition of:
(a) at least one compound having structure VI $$V^1-Y-V^2 \text{ VI}$$

wherein Y is selected from the group consisting of S, O, $NR^2$, $(HOCH)_p$, and

[structure: pyrazine ring with $(R^1)_2$ substituent]

each $R^1$ is independently selected from H, an alkyl group, an alkenyl group, an alkynyl group, an alkoxy group or a halogen, each $R^2$ is independently H, SH, $CH_3$, $C_2H_5$, and a linear or branched $C_1$-$C_4$ alkyl group containing a thiol group; and wherein $V^1$ and $V^2$ are independently selected from $$HS-(CH_2)_m\text{—} \quad \text{and} \quad (R^1)_{5-n}\text{—[phenyl ring]—}(SH)_n$$

wherein, m is independently an integer from 0 to 4 with the proviso that m can=0 only when Y=

[structure: pyrazine ring with $(R^1)_2$ substituent]

n is an integer from 1 to 5; p is an integer of from 1 to 4, and each $R^1$ is defined as above;
(b) at least one organic solvent, and optionally,
(c) at least one adhesion promoter;
wherein the amount of the compound of Structure VI present in the composition is effective to inhibit residue from forming when the photosensitive composition is coated on a substrate and the coated substrate is processed to form an image thereon.

12 Claims, No Drawings

PRETREATMENT COMPOSITIONS

RELATED APPLICATIONS

This application claims priority from Provisional Patent Application No. 60/687,433 filed Jun. 3, 2005.

FIELD OF THE INVENTION

The present invention relates to copper compatible pretreatment compositions and a process of use for said compositions, and electronic parts produced by said process of use. More specifically, the present invention relates to use of a pretreatment composition with photosensitive buffer coat compositions.

BACKGROUND OF THE INVENTION

In microelectronic applications, polymers that demonstrate high temperature resistance, such as polyimides and polybenzoxazoles, are generally well known. Precursors of such polymers, can be made photoreactive with suitable additives. The precursors are converted to the desired polymer by known techniques such as exposure to high temperatures. The polymer precursors are used to prepare protective layers, insulating layers, and relief structures of highly heat-resistant polymers.

As the dimensions of photolithographic patterns on wafers continue to shrink below 0.15 microns, greater demands continue to be placed on lithographic equipment and materials. To meet this challenge, the semiconductor industry is changing from aluminum based alloys and silicon dioxide to copper metal and low dielectric constant (low-k) materials to manufacture chips. Copper is known to have as much as 40% decreased electrical resistance. Moreover, when using low-k materials there is a decrease in capacitance, which is critical to improving integrated circuit performance, especially for higher density memory chips. More and more, the metal substrate and inter-dielectric layer materials are changing from aluminum based alloys and silicon dioxide to copper metal and the new low-k dielectrics. Copper has lower electrical resistance, carries higher current densities, and has improved electromigration resistance compared to aluminum. Thus, copper interconnects allow decreasing transistor size and shorter connections that result in faster, more powerful devices.

Copper metallization provides a challenge to the semiconductor industry since copper can act as a catalyst and destabilize systems that are optimized for coating over aluminum. In addition, cuprous and cupric ions present on the copper surface can bind strongly with some polymers and reduce the ability to dissolve the polymers during certain wafer coating processes, which leaves undesired and detrimental residues behind. Further, without good adhesion of overlying structures to the Cu, non-adherent oxides can form resulting in device failure. With the increased use of copper metallization in semiconductor devices, it is important to develop photosensitive coating systems that are compatible with copper and copper processing.

SUMMARY OF THE INVENTION

The present invention is directed to a pretreatment composition comprising:

(a) at least one compound having structure VI $$V^1—Y—V^2 \quad\quad VI$$

wherein Y is selected from the group consisting of S, O, $NR^2$, $(HOCH)_p$, and

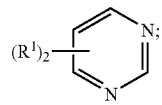

each $R^1$ is independently selected from the group consisting of H, an alkyl group, an alkenyl group, an alkynyl group, an alkoxy group or a halogen, each $R^2$ is independently selected from the group consisting of H, SH, $CH_3$, $C_2H_5$, and a linear or branched $C_1$-$C_4$ alkyl group containing a thiol group; and wherein $V^1$ and $V^2$ are independently selected from the group consisting of

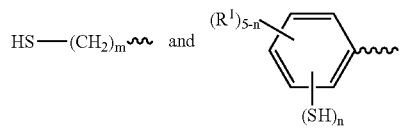

wherein, m is independently an integer from 0 to 4 with the proviso that m can =0 only when Y=

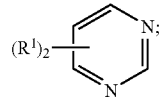

n is an integer from 1 to 5; p is an integer of from 1 to 4, and each $R^1$ is defined as above;

(b) at least one organic solvent, and optionally, (c) at least one adhesion promoter;

wherein the amount of the compound of Structure VI present in the composition is effective to inhibit residue from forming when the photosensitive composition is coated on a substrate and the coated substrate is subsequently processed to form an image on the substrate. This effective amount of compound of Structure VI will vary depending upon, at least the following, the amount of organic solvent employed, the specific organic solvent employed, and the specific compound of Structure VI employed. The form of the pretreatment composition is a non-aqueous composition.

The present invention also is directed to processes for forming relief patterns and electronic parts using the composition.

DETAILED DESCRIPTION OF THE INVENTION

One embodiment of the present invention is directed to a pretreatment composition comprising:

(a) at least one compound having structure VI $$V^1—Y—V^2 \quad\quad VI$$

wherein Y is selected from the group consisting of S, O, $NR^2$, $(HOCH)_p$, and

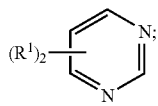

each R[1] is independently selected from the group consisting of H, an alkyl group, an alkenyl group, an alkynyl group, an alkoxy group or a halogen, each R[2] is independently selected from the group consisting of H, SH, $CH_3$, $C_2H_5$, and a linear or branched $C_1$-$C_4$ alkyl group containing a thiol group; and wherein $V^1$ and $V^2$ are independently selected from the group consisting of

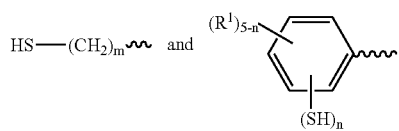

wherein, m is independently an integer from 0 to 4 with the proviso that m=0 only when Y=

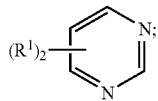

n is an integer from 1 to 5; p is an integer of from 1 to 4, and each R[1] is defined as above;

(b) at least one organic solvent, and optionally, (c) at least one adhesion promoter;

wherein the amount of the compound of Structure VI present in the composition is an amount of the compound of Structure VI that along with the amount of the organic solvent present in the composition is effective to inhibit residue from forming when the composition is coated on a substrate and the coated substrate is subsequently processed to form an image on the substrate.

Examples of compounds having structure VI include but are not limited to:

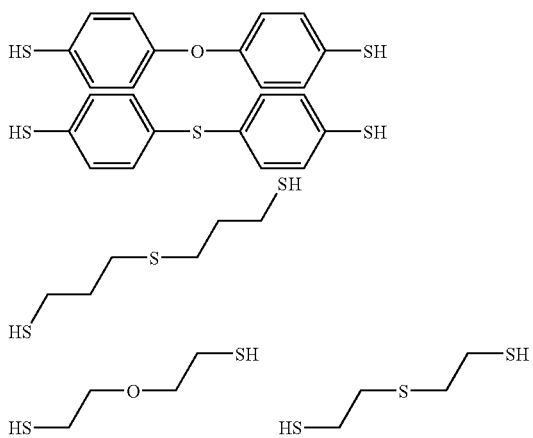

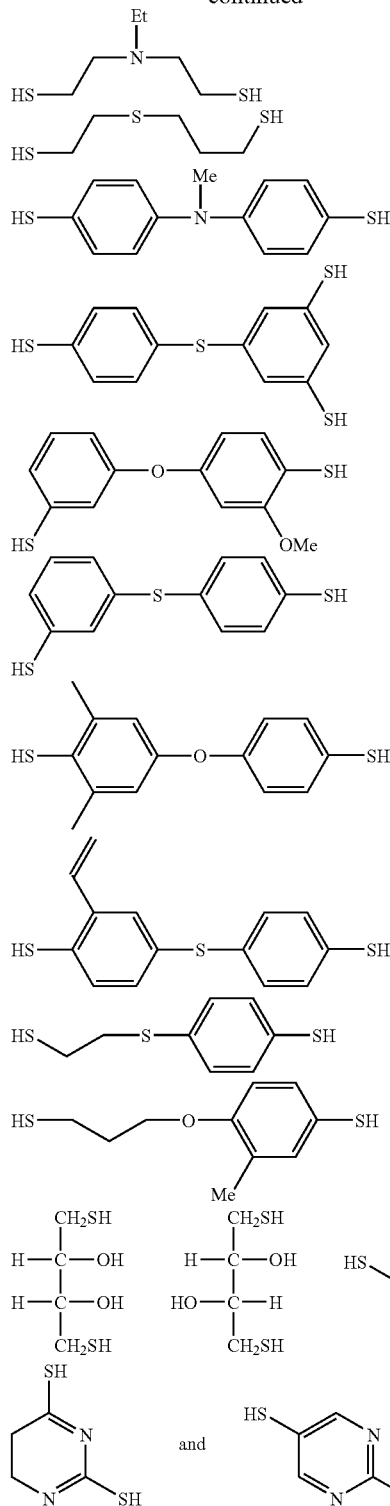

Examples of compounds of Structure VI can be purchased commercially or synthesized using synthetic procedures known to those skilled in the art.

Some of the compounds generally described by Structure VI can also exist (and may preferentially exist) in the tautomeric form VI' in certain situations. For the purposes of the description of this invention, both tautomeric forms are considered to be described by Structure VI.

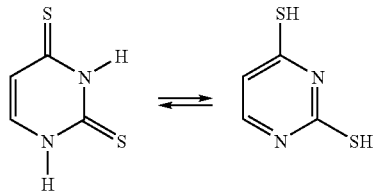

A preferred range for m is from 1 to 3. Another preferred range for m is from 2 to 4. A more preferred range for m is from 2-3. Another more preferred range for m is from 3 to 4. A most preferred m is 2. A preferred range for n is from 1 to 3. A more preferred range for n is from 1 to 2. A most preferred n is 1.

Preferred compounds of Structure VI are those wherein Y is selected from the group consisting of S, $(HOCH)_m$, and

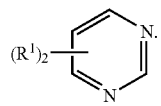

Examples of preferred compounds of Structure VI include, but are not limited to:

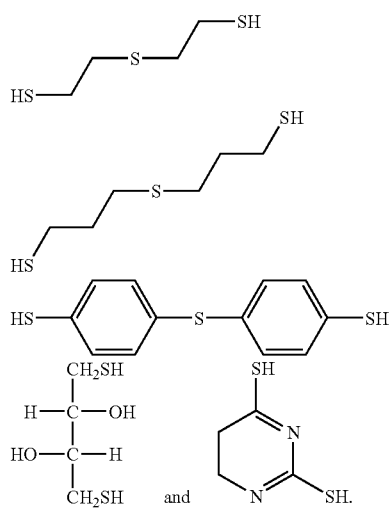

More preferred compounds of Structure VI are those wherein Y is selected from the group consisting of S, and

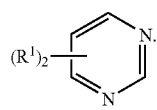

Examples of more preferred compounds of Structure VI include, but are not limited to

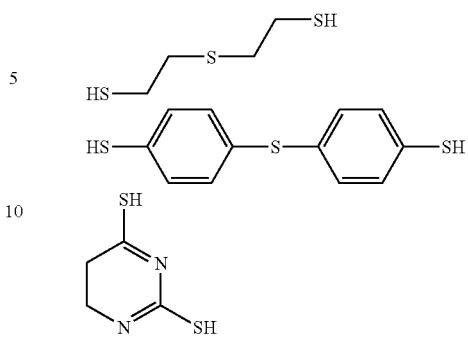

Suitable organic solvents of this composition are mildly polar to strongly polar organic solvents. Examples of suitable classes of solvents include ketones, non-cyclic esters, cyclic esters (lactones), alcohols, non-cyclic amides, and cyclic amides (lactams). Suitable examples of such organic solvents include, but are not limited to, N-methyl-2-pyrrolidone (NMP), N-ethyl-2-pyrrolidone (NEP), gamma-butyrolactone (GBL), N,N-dimethylacetamide (DMAc), dimethyl-2-piperidone, N,N-dimethylformamide (DMF), ketones such as 2-pentanone, cyclopentanone, 2-hexanone, and 2-heptanone, esters such as propylene glycol monomethyl ether acetate, ethyl acetate, methyl methoxypropionate, ethyoxyethyl propionate, and ethyl lactate, alcohols such as 1-methoxy-2-propanol, and 1-pentanol, and mixtures thereof. The preferred solvents are gamma-butyrolactone, N-ethyl-2-pyrrolidone and N-methyl-2-pyrrolidone. The most preferred solvent is gamma-butyrolactone.

The effective amount of compound having Structure VI may vary depending on the particular compound employed and the amount and particular organic solvent employed. In general, the amount of compound having Structure VI used in this composition is from about 0.2 wt % to about 25 wt % of the total weight of the composition, preferably, from about 0.75 wt % to about 18 wt %, and more preferably, from about 1.0 wt % to about 15 wt %. In some cases the effective amount of compound having Structure VI may not be soluble in a preferred solvent so an alternative solvent must be selected.

The organic solvent component (b) comprises from about 75 wt % to about 99.8 wt % of the composition. A preferred solvent range is from about 82 wt % to about 99.25 wt %. A more preferred range of solvent is from about 85 wt % to about 99 wt %.

Optionally, an adhesion promoter may be included in the composition. If employed, the amount of adhesion promoter ranges from about 0.1 wt % to about 2 wt % of total weight of composition. A preferred amount of adhesion promoter is from about 0.2 wt % to about 1.5 wt %. A more preferred amount of adhesion promoter is from about 0.3 wt % to about 1 wt %. Suitable adhesion promoters include, for example, amino silanes, and mixtures or derivatives thereof. Examples of suitable adhesion promoters which may be employed in the invention may be described by Structure XIV

XIV

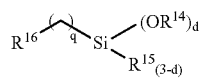

wherein each $R^{14}$ is independently a $C_1$-$C_4$ alkyl group or a $C_5$-$C_7$ cycloalkyl group and each $R^{15}$ is independently a $C_1$-$C_4$ alkyl group, a $C_1$-$C_4$ alkoxy group, a $C_5$-$C_7$ cycloalkyl group or a $C_5$-$C_7$ cycloalkoxy group; d is an integer from 0 to 3 and q is an integer from 1 to about 6, and $R^{16}$ is one of the following moieties:

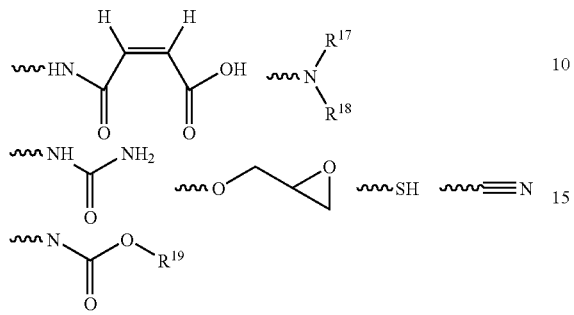

wherein each $R^{17}$ and $R^{18}$ are each independently a $C_1$-$C_4$ alkyl group or a $C_5$-$C_7$ cycloalkyl group, and $R^{19}$ is a $C_1$-$C_4$ alkyl group or a $C_5$-$C_7$ cycloalkyl group. Preferred adhesion promoters are those wherein $R^{16}$ are

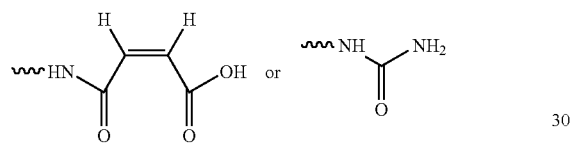

More preferred adhesion promoters are those wherein $R^{16}$ is

The most preferred adhesion promoters are

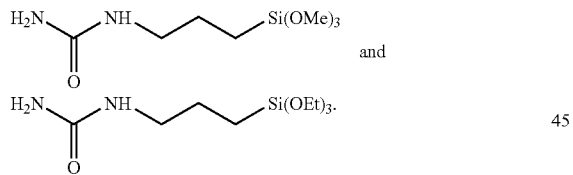

The compositions of the present invention may further include other additives. Suitable additives include, for example, leveling agents, surfactant and the like. Such additives may be included in the pretreatment compositions in about 0.03 wt % to about 10 wt % of the total weight of composition.

The composition of this embodiment may be employed to produce electronic components such as semiconductor devices and multi-layered interconnections boards.

Another embodiment of the present invention is directed to a process for forming a relief pattern using a positive tone photosensitive composition containing at least one polybenzoxazole precursor polymer that does not contain an acid labile functional group. The process comprises the steps of:

(a) pretreating a substrate using a pretreatment composition comprising one or more compounds of Structure VI, an organic solvent, and optionally an adhesion promoter, $$V^1\text{—}Y\text{—}V^2 \qquad VI$$

wherein Y is selected from the group consisting of S, O, $NR^2$, $(HOCH)_p$, and

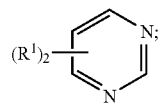

each $R^1$ is independently selected from the group consisting of H, an alkyl group, an alkenyl group, an alkynyl group, an alkoxy group or a halogen, each $R^2$ is independently selected from the group consisting of H, SH, $CH_3$, $C_2H_5$, and a linear or branched $C_1$-$C_4$ alkyl group containing a thiol group; and wherein $V^1$ and $V^2$ are independently selected from the group consisting of

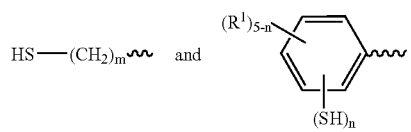

wherein, m is independently an integer from 0 to 4 with the proviso that m=0 only when Y=

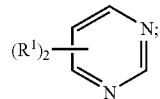

n is an integer from 1 to 5; p is an integer of from 1 to 4, and each $R^1$ is defined as above;

(b) coating on the pretreated substrate, a positive-working photosensitive composition comprising at least one polybenzoxazole precursor polymer that does not contain at least one acid labile functional group, at least one diazonaphthoquinone photoactive compound, and at least one solvent, thereby forming a coated substrate, (c) baking the coated substrate, (d) exposing the baked coated substrate to actinic radiation, and (e) developing the exposed coated substrate with an aqueous developer, thereby forming an uncured relief image on the coated substrate.

Suitable substrates such as a copper or a copper-coated wafer are first pretreated by the composition of this invention. The substrate for the copper coated wafer may be, for example, semiconductor materials such as a silicon wafer or a ceramic substrate, glass, or other metal, or plastic. The most preferred substrate is a copper coated substrate.

The pretreatment of the substrate can be accomplished in a variety of ways. The substrate must be brought into contact with the pretreatment composition so as to completely cover at least the surface of the substrate to be treated, for a short period of time and then dried.

Application of the pretreatment composition can be carried out by numerous means known to those in the art. Examples of application means include, but are not limited to, stream, spray, mist with the pretreatment composition, and immersion of the substrate into a bath of the pretreatment composition. The substrate may be rotating, static, or otherwise moving during this application as long as the pretreatment composition is distributed evenly over the surface and not removed too rapidly. Preferred application means for the pretreatment composition include spray and stream onto the substrate placed horizontally on a spin chuck in the center of a spin bowl on a coating tool.

When contacting the pretreatment composition with the substrate in the spin bowl, the spin speed of the substrate during application of the pretreatment composition and contact time thereafter can range from about 0 rpm to about 2000 rpm for about 1 second to about 100 seconds. Higher spin speeds tend to result in uneven treatment of the substrate. A preferred spin speed range is from about 50 rpm to about 1500 rpm. A more preferred spin sped range is from about 100 rpm to about 500 rpm. The pretreatment composition may be applied with the substrate at 0 rpm until the desired contact time is complete. Alternatively, the pretreatment composition may be applied while the substrate is rotating so as to spread the pretreatment composition rapidly over the substrate and then de-accelerated to 0 rpm. Alternatively, the substrate may continue spinning during the contact time.

The rate at which the pretreatment composition is applied, and the volume of pretreatment composition necessary, may vary somewhat with the specific method and time employed, the size of the substrate, and the rotational speed, if employed. Routine experimentation by those skilled in the art can determine exact volumes. A preferred process dispenses 3 ml of pretreatment composition onto a substrate spinning at 200 rpm during a ten second period.

The pretreatment composition should remain in contact with the substrate from about 1 second to about 100 seconds. A preferred contact time between the substrate and the pretreatment composition is from about 4 seconds to about 20 seconds. A more preferred contact time between the substrate and the pretreatment composition is from about 5 seconds to about 10 seconds.

The temperature of the pretreatment composition may range from about 5° C. to about 45° C. Preferably, the temperature ranges from about 15° C. to about 35° C. More preferably, the temperature ranges from about 20° C. to about 30° C.

After the desired contact time has been achieved, the substrate is dried. Numerous drying means known to those in the art may be employed. Examples of suitable drying means include, but are not limited to, air drying, blowing with a stream of nitrogen, baking, or spinning or combinations thereof. Suitable baking means are known to those skilled in the art. Examples of suitable baking means include, but are not limited to, hot plates, and thermal or infrared ovens. The preferred drying means is spinning the substrate. Specific drying means may be preferred based on the contact method. For example, for contact in the spin bowl, spin drying or hot plate bake are preferred. For an immersion contact method, a nitrogen stream or a multi-wafer spin dry system may be preferred.

The time required for drying will depend on the specific drying means employed, the temperature, and the solvent of the pretreatment composition. Higher boiling solvents will require more vigorous drying means such as longer times or higher temperatures. Bakes at about 40° C. to about 120° C. for about 20 seconds to about 60 seconds are suitable. Spin drying can be accomplished by spinning the substrate at from about 500 rpm to about 1000 rpm for from about 50 seconds to about 120 seconds. Alternatively, higher spin speeds for shorter times may be employed such as 2000 rpm for from about 20 to about 50 seconds. There are no known problems with longer contact times. However, throughput will suffer with longer contact times. Those skilled in the art can easily determine suitable conditions for the specific combinations of elements employed without undue experimentation.

The process may include other optional steps. Examples of optional steps include, but are not limited to the steps of post exposure baking the exposed coated substrate at an elevated temperature prior to developing, rinsing the developed relief image and substrate after development, and treating the substrate with an adhesion promoter. Typically the latter optional step is not done when an adhesion promoter is included in the photosensitive composition or the pretreatment composition.

Any suitable method of treatment of the substrate with adhesion promoter known to those skilled in the art may be employed. Examples include treatment of the substrate with adhesion promoter vapors, solutions or at 100% concentration. The time and temperature of treatment will depend on the particular substrate, adhesion promoter, and method, which may employ elevated temperatures. Any suitable external adhesion promoter may be employed. Classes of suitable external adhesion promoters include but are not limited to vinylalkoxysilanes, methacryloxyalkoxysilanes, mercaptoalkoxysilanes, aminoalkoxysilanes, epoxyalkoxysilanes and glycidoxyalkoxysilanes. Aminosilanes and glycidoxysilanes are more preferred. Primary aminoalkoxysilanes are more preferred. Examples of suitable external adhesion promoters include, but are not limited to gamma-aminopropyltrimethoxy-silane, gamma-glycidoxypropylmethyldimethoxysilane, gamma-glycidoxypropylmethyldiethoxysilane, gamma-mercaptopropylmethyldimethoxysilane, 3-methacryloxypropyldimethoxymethylsilane, and 3-methacryloxypropyltrimethoxysilane. gamma-Aminopropyltrimethoxysilane is more preferred. Additional suitable adhesion promoters are described in "Silane Coupling Agent" Edwin P. Plueddemann, 1982 Plenum Press, New York. The adhesion promoter treatment may take place before or after the pretreatment with the pretreatment composition containing one or more compounds of Structure VI.

One positive photosensitive resin composition that can be used in this invention comprises at least one polybenzoxazole precursor polymer, at least one diazonaphthoquinone photoactive compound, and at least one solvent.

The positive photosensitive resin composition comprises at least one polybenzoxazole precursor polymer having Structure I, II, III*, IV, IV* or V.

I

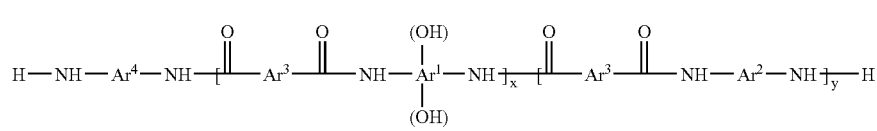

-continued $$H-NH-Ar^4-NH-\overset{O}{\underset{}{C}}-Ar^3-\overset{O}{\underset{}{C}}-NH-Ar^1\underset{(OH)_k^2}{\overset{(OD)_K^1}{|}}-NH\underset{x}{\rbrack}-\overset{O}{\underset{}{C}}-Ar^3-\overset{O}{\underset{}{C}}-NH-Ar^2-NH\underset{y}{\rbrack}-H \quad\text{II}$$

$$G-NH-Ar^4-NH-\overset{O}{\underset{}{C}}-Ar^3-\overset{O}{\underset{}{C}}-NH-Ar^1\underset{OH}{\overset{OH}{|}}-NH\underset{x}{\rbrack}-\overset{O}{\underset{}{C}}-Ar^3-\overset{O}{\underset{}{C}}-NH-Ar^2-NH\underset{y}{\rbrack}-G \quad\text{III}$$

$$G^*-N-Ar^4-NH-\overset{O}{\underset{}{C}}-Ar^3-\overset{O}{\underset{}{C}}-NH-Ar^1\underset{OH}{\overset{OH}{|}}-NH\underset{x}{\rbrack}-\overset{O}{\underset{}{C}}-Ar^3-\overset{O}{\underset{}{C}}-NH-Ar^2-N\underset{y}{\rbrack}-G^* \quad\text{III*}$$

$$G-NH-Ar^4-NH-\overset{O}{\underset{}{C}}-Ar^3-\overset{O}{\underset{}{C}}-NH-Ar^1\underset{(OH)_K^2}{\overset{(OD)_K^1}{|}}-NH\underset{x}{\rbrack}-\overset{O}{\underset{}{C}}-Ar^3-\overset{O}{\underset{}{C}}-NH-Ar^2-NH\underset{y}{\rbrack}-G \quad\text{IV}$$

$$G^*-N-Ar^4-NH-\overset{O}{\underset{}{C}}-Ar^3-\overset{O}{\underset{}{C}}-NH-Ar^1\underset{(OH)k^2}{\overset{(OD)k^1}{|}}-NH\underset{x}{\rbrack}-\overset{O}{\underset{}{C}}-Ar^3-\overset{O}{\underset{}{C}}-NH-Ar^2-N\underset{y}{\rbrack}-G^* \quad\text{IV*}$$

$$-(CO-Ar^7\underset{(COOR^4)_{m^2}}{\overset{(OH)_{m^1}}{|}}-CONH-Ar^8\overset{(OH)_{m^3}}{|}-NH)_x- \quad\text{V}$$

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group which may contain silicon; $Ar^3$ is a divalent aromatic group, a divalent aliphatic group, a divalent heterocyclic group, or mixtures thereof; $Ar^4$ is $Ar^1 (OH)_2$ or $Ar^2$, x is from about 10 to about 1000; y is from 0 to about 900; D is one of the following moieties:

D-1

D-2

D-3

D-4

D-5 wherein, R is H, halogen, a $C_1$-$C_4$ alkyl group, a $C_1$-$C_4$ alkoxy group, cyclopentyl, or cyclohexyl; $k^1$ can be any positive value of up to about 0.5, $k^2$ can be any value from about 1.5 to about 2 with the proviso that $(k^1+k^2)=2$, G is a monovalent organic group having a carbonyl, carbonyloxy or sulfonyl group, G* is a divalent organic group having at least one carbonyl or sulfonyl group; $Ar^7$ represents a bivalent to octavalent organic group with at least two carbon atoms, $Ar^8$ represent a bivalent to hexavalent organic group with at least two carbon atoms, and $R^4$ represent hydrogen or an organic group with 1 to 10 carbons, $m^1$ and $m^3$ are integers in the range of 0 to 4 but $m^1$ and $m^3$ cannot be simultaneously 0 and $m^2$ is an integer in the range of 0 to 2.

The diazonaphthoquinone (DNQ) photoactive compound of the photosensitive resin composition comprises one or more diazonaphthoquinone photoactive compounds which are the condensation products of compounds containing from 2 to about 9 aromatic hydroxyl groups with a 5-naphthoquinonediazide sulfonyl compound (e.g. chloride) and/or a 4-naphthoquinonediazide sulfonyl compound (e.g. chloride) to yield aromatic sulfonate esters containing the moieties D-2 and/or D-4. Examples of suitable diazonaphthoquinones (XIII) include but are not limited to, those shown below. Additional examples can be found in the references cited below for photosensitive compositions suitable for use in this embodiment.

Examples of compounds XIII include, but are not limited to, one or more of the following compounds where each Q is independently a hydrogen atom or D with the proviso that at least one Q=D wherein D is as defined before:

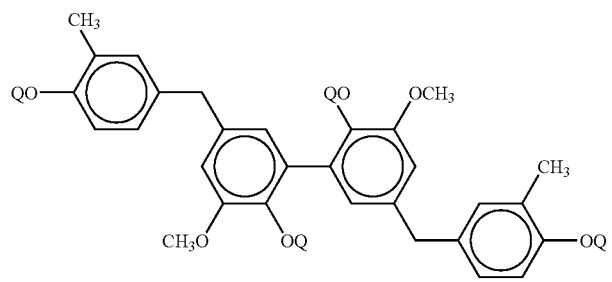

(XIII a)

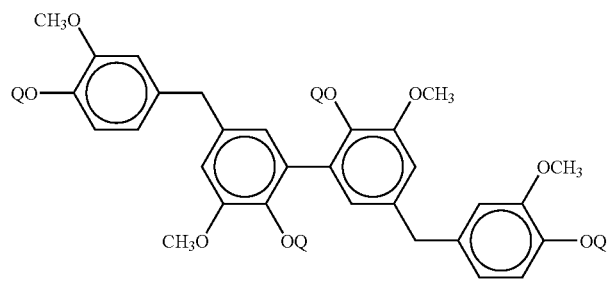

(XIII b)

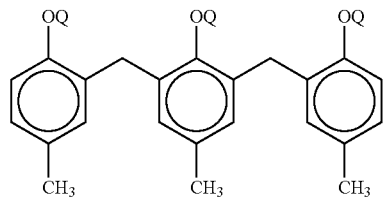

(XIII c)

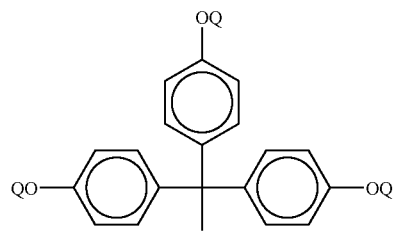

(XIII d)

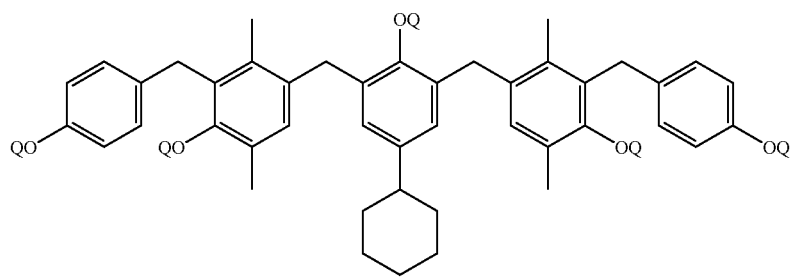
(XIII e)
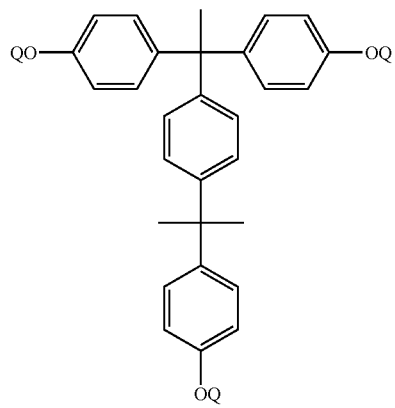
(XIII f)
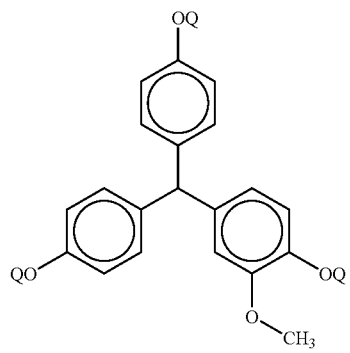
(XIII g)
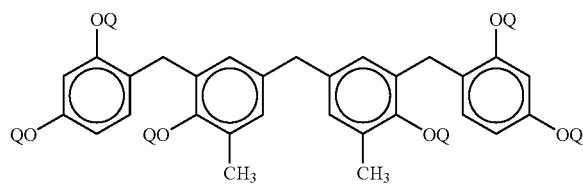
(XIII h)
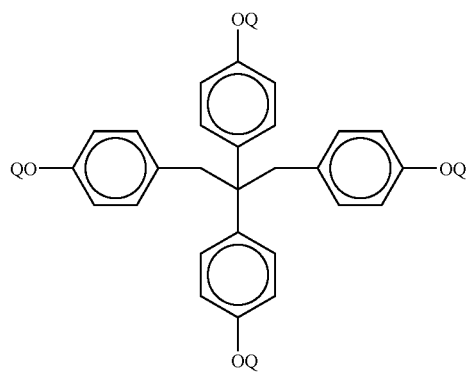
(XIII i)

-continued
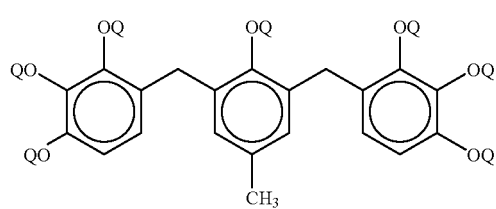
(XIII j)
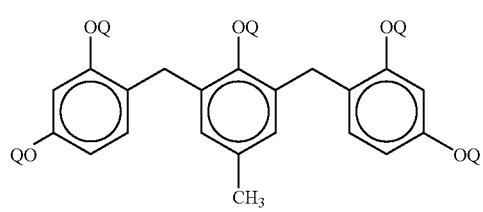
(XIII k)
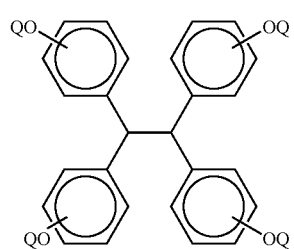
(XIII l)
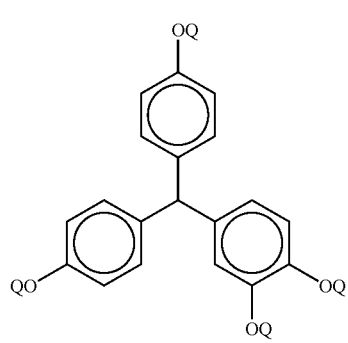
(XIII m)
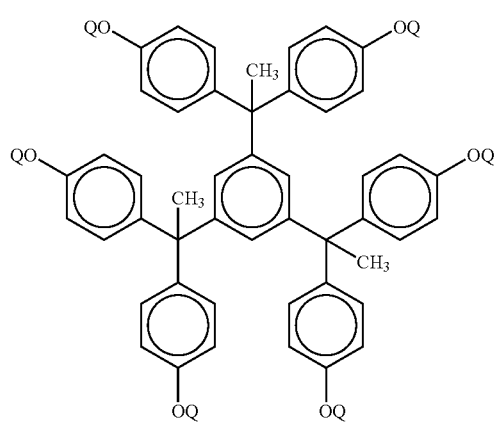
(XIII n)

-continued

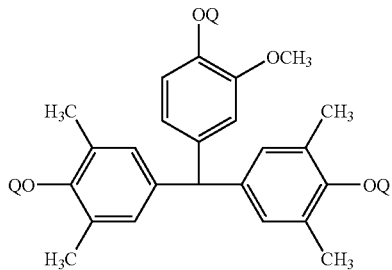
(XIII o)

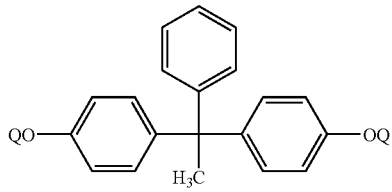
(XIII p)

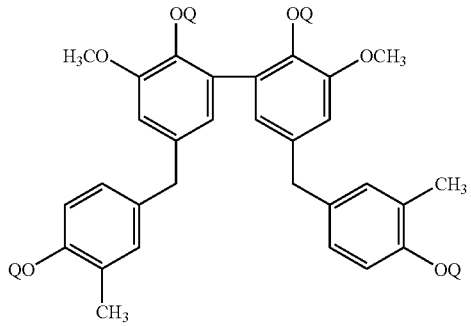
(XIII r)

Suitable solvents of this photosensitive composition are polar organic solvents. Suitable examples of polar organic solvents include but are not limited to, N-methyl-2-pyrrolidone (NMP), N-ethyl-2-pyrrolidone, gamma-butyrolactone (GBL), N,N-dimethylacetamide (DMAc), dimethyl-2-piperidone, N,N-dimethylformamide (DMF), and mixtures thereof. The preferred solvents are gamma-butyrolactone, N-ethyl-2-pyrrolidone, and N-methyl-2-pyrrolidone. The most preferred solvent is gamma-butyrolactone.

Examples of suitable polybenzoxazole precursor resins and positive tone photosensitive compositions suitable for use in this embodiment include, but are not limited to, those described in U.S. Pat. Nos. 4,849,051, 5,037,720, 5,081,000, 5,376,499, 5,449,584, 6,071,666, 6,120,970, 6,127,086, 6,153,350, 6,177,255, 6,214,516, 6,232,032, 6,235,436B1, 6,376,151, 6,524,764, 6,607,865, U.S. Patent Publication No. 2004/0142275, U.S. Patent Publication No. 2004/0229160, U.S. Patent Publication No. 2004/0229167, and U.S. Patent Publication No. 2004/0249110, which are all hereby incorporated by reference.

The positive acting, photoactive composition is coated on top of the pre-treated substrate. Coating methods include, but are not limited to spray coating, spin coating, offset printing, roller coating, screen printing, extrusion coating, meniscus coating, curtain coating, and immersion coating. The resulting film is prebaked at an elevated temperature. The bake may be completed at one or more temperatures within the temperature range of from about 70° C. to about 120° C. for several minutes to half an hour, depending on the method, to evaporate the remaining solvent. Any suitable baking means may be employed. Examples of suitable baking means include, but are not limited to, hot plates and convection ovens. The resulting dry film has a thickness of from about 3 microns to about 50 microns or more preferably from about 4 microns to about 20 microns or most preferably from about 5 microns to about 15 microns.

After the bake step, the resulting dry film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, in an optional step, it may be advantageous to bake the exposed and coated substrate to a temperature between about 70° C. and 120° C. The exposed and coated substrate is heated in this temperature range for a short period of time, typically several seconds to several minutes and may be carried out using any suitable heating means. Preferred baking means include baking on a hot plate or in a convection oven. This process step is commonly referred to in the art as post exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, aqueous ammonia), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddle, or other similar developing methods at temperatures from about 10° C. to about 40° C. for about 30 seconds to about 5 minutes. The development may occur in two stages or more stages where fresh developer is applied after an initial development period. This is a useful technique when developing thick films as the activity of the developer may become lower due to dissolution of the exposed photosensitive composition.

After development, the relief pattern may be optionally rinsed using deionized water and dried by spinning, baking on a hot plate, in an oven, or other suitable means.

The benzoxazole ring is then formed by curing of the uncured relief pattern to obtain the final high heat resistant pattern.

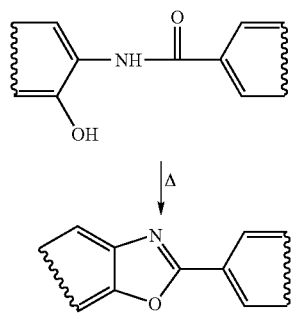

Formation of polybenzoxazole ring

Curing is performed by baking the developed, uncured relief pattern at or above the glass transition temperature ($T_g$) of the photosensitive composition to obtain the benzoxazole ring which provides high heat resistance. Typically, temperatures above about 200° C. are used. Preferably, temperatures from about 250° C. to about 400° C. are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably, under a blanket of nitrogen and may be carried by any suitable heating means. Preferred means include baking on a hot plate or in a convection or vacuum oven or in a tube furnace.

The process of this embodiment may be employed to produce electronic components such as semiconductor devices and multi-layered interconnections boards.

Another embodiment of the present invention is directed to a process for forming a relief pattern using a chemically amplified positive tone photosensitive composition containing a polybenzoxazole precursor polymer. The process comprises the steps of:

(a) pretreating a substrate using a pretreatment composition comprising one or more compounds of Structure VI, an organic solvent, and optionally an adhesion promoter;

$$V^1—Y—V^2 \quad\quad VI$$

wherein Y is selected from the group consisting of S, O, $NR^2$, $(HOCH)_m$, and

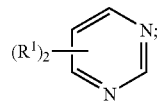

each $R^1$ is independently selected from the group consisting of H, an alkyl group, an alkenyl group, an alkynyl group, an alkoxy group or a halogen, each $R^2$ is independently selected from the group consisting of H, SH, $CH_3$, $C_2H_5$, and a linear or branched $C_1$-$C_4$ alkyl group containing a thiol group; and wherein $V^1$ and $V^2$ are independently selected from the group consisting of

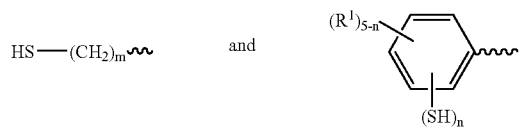

wherein, m is independently an integer from 0 to 4 with the proviso that m=0 only when Y=

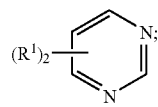

n is an integer from 1 to 5; and each $R^1$ is defined as above;

(b) coating on said pretreated substrate, a positive-working photosensitive composition comprising at least one polybenzoxazole precursor polymer bearing at least one acid labile functional group; at least one photo acid generator (PAG) and at least one solvent, (c) baking the coated substrate, (d) exposing the coated substrate to actinic radiation, (e) post exposure baking the coated substrate at an elevated temperature, and (f) developing the coated substrate with an aqueous developer, thereby forming an uncured relief image.

The process may include other optional steps. Examples of optional steps include, but are not limited to, the steps of rinsing the developed relief image and substrate after development, and treating the substrate with an adhesion promoter as described in an earlier embodiment. Typically the latter optional step is not done when an adhesion promoter is included in the photosensitive composition or the pretreatment composition.

In this embodiment, the suitable substrates, treatment composition, and treatment process are as described previously.

The chemically amplified positive tone photosensitive composition comprises:

(a) at least one polybenzoxazole precursor bearing at least one acid labile functional group (b) at least one photoactive compound which releases acid upon irradiation (PAG), and (c) at least one solvent.

Optionally, the photosensitive composition may contain other additives which include but are not limited to photosensitizers, adhesion promoters, and leveling agents.

Examples of polybenzoxazole precursor polymers bearing at least one acid labile functional group, PAGs, and positive photosensitive resin compositions that are suitable for use in this embodiment include, but are not limited to, those described in U.S. Pat. No. 6,143,467, U.S. Patent Publication No. 2002/0037991, U.S. Patent Publication No. 2003/0099904, U.S. Patent Publication No. 2003/0087190, U.S. Patent Publication No. 2003/0100698, U.S. Patent Publication No. 2003/0104311, U.S. Patent Publication No. 2003/0134226 and U.S. Patent Publication No. 2004/0253542, all hereby incorporated by reference.

Examples of suitable polybenzoxazole precursor polymers bearing at least one acid labile functional group are the polymers represented by Structures VII and VII* where B is an acid labile group which reacts to unmask a phenolic group and wherein $k^1$ can be any number between 0.1 and 2, $k^2$ can be any number between 0-1.9 provided that $(k^1+k^2)=2$ and $Ar^1, Ar^2, Ar^3, Ar^4, x, y, G$, and $G^*$ are as previously defined.

Mixtures of acid sensitive groups may be employed. Such polymers can be synthesized from polymers having structure III and III* using procedures known to those in the art and described in the references above.

The positive-working formulation of the present embodiment uses photoactive compounds which release acid upon irradiation. Such materials are commonly called PhotoAcid Generators (PAGs). PAGs used in the present invention are preferably active to the radiation between about 300 nm to about 460 nm. They should form a homogeneous solution in the photosensitive composition and produce strong acid upon irradiation. Examples of such acids include hydrogen halides or a sulfonic acid. The classes of such PAGs include, but are not limited to, oxime sulfonates, triazines, diazoquinone sulfonates, or sulfonium or iodonium salts of sulfonic acids. Examples of suitable PAGs include but are not limited to:

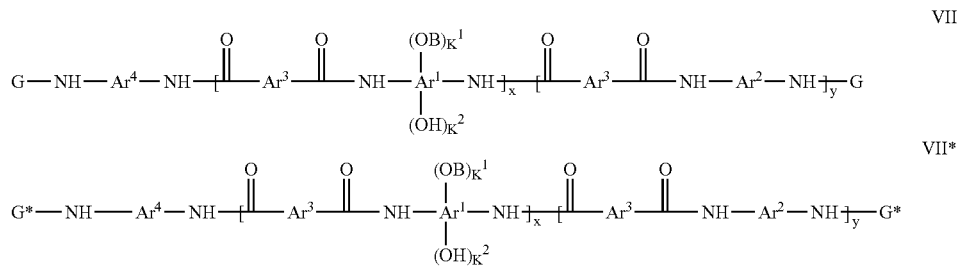

Examples of suitable acid sensitive groups B include, but are not limited to the following groups:

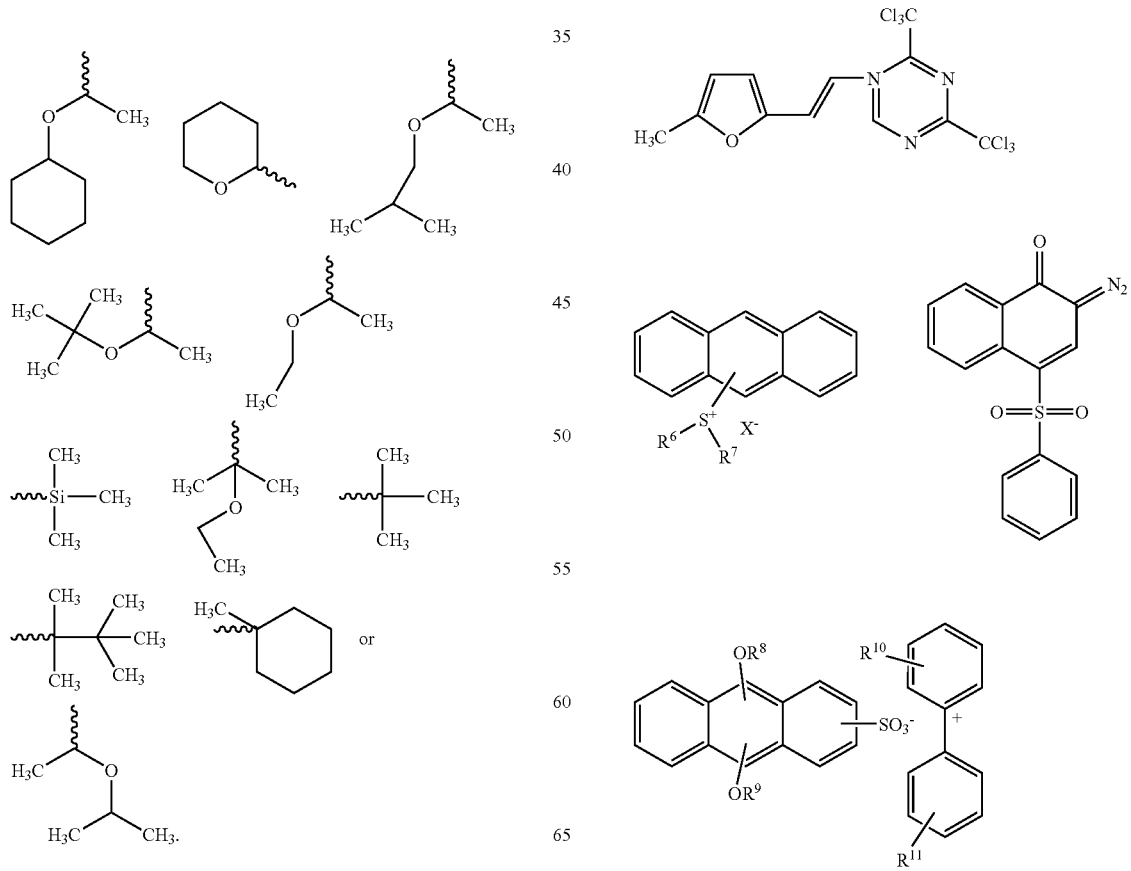

-continued

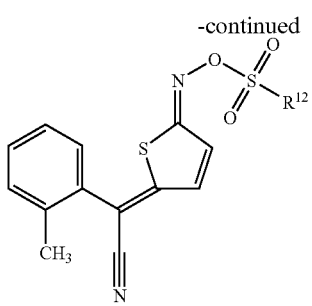

where $R^6$ and $R^7$ are each independently linear, branched or cyclic alkyl or aryl group containing 1 to 20 carbon atoms and X— is $R^{13}SO3$-. $R^{13}$ is a substituted or unsubstituted, linear, branched or cyclic $C_1$-$C_{25}$ alkyl or a single or multinuclear aryl group having a total of from 6 to 25 carbons; $R^8$, $R^9$, $R^{10}$ and $R^{11}$ are independently linear, branched or cyclic alkyl groups and $R^{12}$ is a linear or branched $C_1$-$C_8$ alkyl, $C_5$-$C_8$ cycloalkyl, camphoroyl or toluyl group.

Alternatively, acid could be generated by a combination of PAG and sensitizer. In such systems energy of radiation is absorbed by the sensitizer and transmitted in some manner to the PAG. The transmitted energy causes PAG decomposition and generation of photoacid. Any suitable photoacid generator compound may be used. Suitable classes of photoacid generators generating sulfonic acids include, but are not limited to, sulfonium or iodonium salts, oximidosulfonates, bis-sulfonyldiazomethane compounds, and nitrobenzylsulfonate esters. Suitable photoacid generator compounds are disclosed, for example, in U.S. Pat. Nos. 5,558,978 and 5,468,589 which are incorporated herein by reference. Other suitable photoacid generators are perfluoroalkyl sulfonyl methides and perfluoroalkyl sulfonyl imides as disclosed in U.S. Pat. No. 5,554,664.

Still other suitable examples of photoacid generators are triphenylsulfonium trifluoromethanesulfonate, diphenylethylsulfonium trifluoromethanesulfonate, phenacyldimethylsulfonium trifluoromethanesulfonate, phenacyltetrahydrothiophenium trifluoromethanesulfonate, 4-nitrophenacyltetrahydrothiopheniumn trifluoromethanesulfonate, and 4-hydroxy-2-methylphenylhexahydrothiopyrylium trifluoromethanesulfonate.

Additional examples of suitable photoacid generators for use in this invention include triphenylsulfonium perfluorooctanesulfonate, triphenylsulfonium perfluorobutanesulfonate, methylphenyldiphenylsulfonium perfluorooctanesulfonate, methylphenyldiphenysulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this embodiment include, but are not limited to, diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyidiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfony1)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, and 2,4-dinitrobenzyl p-trifluoromethylbenzene-sulfonate.

Examples of sensitizers include but are not limited to: 9-methylanthracene, anthracenemethanol, acenaphthalene, thioxanthone, methyl-2-naphthyl ketone, 4-acetylbiphenyl, 1,2-benzofluorene.

The solvent should not interfere with the photoacid generation from the PAG, should dissolve all components and should enable casting a good film. Suitable solvents include, but are not limited to, organic solvents, such as gamma-butyrolactone (GBL), propylene glycol methyl ether acetate (PGMEA), methoxy ethyl ether and mixtures thereof. The preferred solvent is gamma-butyrolactone.

The positive acting, photosensitive compositions comprising at least one polybenzoxazole precursor polymer bearing at least one acid labile functional group, at least one photoactive compound which releases acid upon irradiation (PAG), and at least one solvent are coated onto a suitable substrate. The coating, baking, exposing, developing and curing steps are as described previously.

Subsequent to the baking step, the resulting film is exposed to actinic rays through a mask. X-rays, electron beam, ultraviolet rays, visible lights and the like can be used as actinic rays. The preferred rays are those with wavelength of 436 nm (g-line), 365 nm (i-line) and 248. The most preferred rays are those with wavelength of 248 nm and 365 nm.

Following exposure to actinic radiation, it is advantageous to heat the coated substrate to a temperature between about 50° C. and about 150° C. The coated substrate is heated within this temperature range for a short period of time, typically several seconds to several minutes. This process step is commonly referred to in the art as post exposure baking.

The process of this embodiment may be employed to produce electronic components such as semiconductor devices and multi-layered interconnections boards.

Another embodiment of the present invention is direct to a process for forming a relief pattern using a negative tone photosensitive composition containing a polybenzoxazole precursor polymer. The process in this embodiment comprises:

(a) pretreating a substrate using a pretreatment composition comprising one or more compounds of Structure VI, an organic solvent, and optionally an adhesion promoter,

wherein Y is selected from the group consisting of S, O, $NR^2$, and

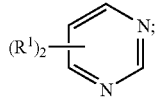

each $R^1$ is independently selected from the group consisting of H, an alkyl group, an alkenyl group, an alkynyl group, an alkoxy group or a halogen, each $R^2$ is independently selected from the group consisting of H, SH, $CH_3$, $C_2H_5$, and a linear or branched $C_1$-$C_4$ alkyl group containing a thiol group; and wherein $V^1$ and $V^2$ are independently selected from the group consisting of

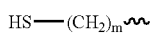 and 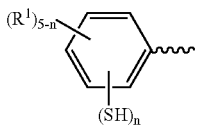

wherein, m is independently an integer from 0 to 4 with the proviso that m=0 only when Y=

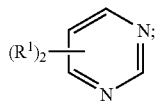

n is an integer from 1 to 5; and each $R^1$ is defined as above;

(b) coating on said substrate, a negative-working photosensitive composition comprising at least one polybenzoxazole precursor polymer, at least one photoactive compound which releases acid upon irradiation, at least one latent crosslinker, and at least one solvent, (c) baking the coated substrate, (d) exposing the coated substrate to actinic radiation, (e) post exposure baking the coated substrate at an elevated temperature, and (f) developing the coated substrate with an aqueous developer, thereby forming an uncured relief image.

The process may include other optional steps. Examples of optional steps include, but are not limited to, the steps of rinsing the developed relief image and substrate after development, and treating the substrate with an adhesion promoter as described in an earlier embodiment. Typically the latter optional step is not done when an adhesion promoter is included in the photosensitive composition or the pretreatment composition.

In this embodiment, the suitable substrates, the treatment composition, and the treatment process are as described previously. The negative acting, photosensitive compositions suitable for this embodiment are coated onto a suitable substrate. The coating, baking, exposing, developing and curing steps are as described previously.

Examples of negative-working photosensitive compositions suitable for this embodiment comprises one or more polybenzoxazole precursor polymers having Structure I or III or III* or mixtures thereof, as described earlier.

The negative-working photosensitive compositions useful in this embodiment use photoactive compounds that release acid upon irradiation. Such materials are commonly called Photo-Acid Generators (PAGs). The PAG is matched with the particular wavelength of light being employed so that the photoacid can be generated. Examples of the classes of PAGs useful in the negative-working photosensitive compositions include, but are not limited to oxime sulfonates, triazides, diazoquinone sulfonates, or sulfonium or iodonium salts of sulfonic acids.

Alternatively, the photoacid could be generated by a combination of a PAG and a sensitizer. In such systems energy of radiation is absorbed by the sensitizer and transmitted in some manner to the PAG. The transmitted energy causes PAG decomposition and generation of photoacid. Any suitable photoacid generator compound may be used. Suitable classes of photoacid generators useful in combination with a sensitizer include, but are not limited to, sulfonium or iodonium salts, oximidosulfonates, bissulfonyldiazomethane compounds, and nitrobenzylsulfonate esters. Suitable photoacid generator compounds are disclosed, for example, in U.S. Pat. Nos. 5,558,978 and 5,468,589, which are incorporated herein by reference. Other suitable photoacid generators are perfluoroalkyl sulfonyl methides and perfluoroalkyl sulfonyl imides as disclosed in U.S. Pat. No. 5,554,664.

Examples of sensitizers useful in this context include, but are not limited to: 9-methylanthracene, anthracenemethanol, acenaphthene, thioxanthone, methyl-2-naphthyl ketone, 4-acetylbiphenyl, 1,2-benzofluorene.

Still other suitable examples of photoacid generators are triphenylsulfonium trifluoromethanesulfonate, diphenylethylsulfonium trifluoromethanesulfonate, phenacyldimethylsulfonium trifluoromethanesulfonate, phenacyltetrahydrothiophenium trifluoromethanesulfonate, 4-nitrophenacyltetrahydrothiopheniumn trifluoromethanesulfonate, and 4-hydroxy-2-methylphenylhexahydrothiopyrylium trifluoromethanesulfonate.

Additional examples of suitable photoacid generators for use in this invention include triphenylsulfonium perfluorooctanesulfonate, triphenylsulfonium perfluorobutanesulfonate, methylphenyldiphenylsulfonium perfluorooctanesulfonate, methylphenyldiphenysulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this invention include, but are not limited to, diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl-p-toluenesulfonate, 2,6-dinitrobenzyl-p-toluenesulfonate, and 2,4-dinitrobenzyl-p-trifluoromethylbenzenesulfonate.

The latent crosslinker of this invention should contain at least two —N—(CH$_2$—OR$^{25}$)$_a$ units wherein R$^{25}$ is an alkyl group of from 1 to 4 carbon atoms and $_a$=1 or 2). When such a structure interacts with an acid, formed after PAG irradiation, a carbocation is believed to be formed (U.S. Pat. No. 5,512,422):

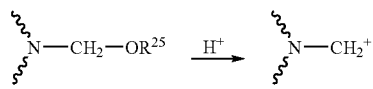

The carbocation formed from the crosslinker can then react with an OH group in a polymer chain or undergo a Friedel-Crafts reaction with an aromatic ring. Reaction of two or more such sites of the crosslinker with two or more polymer chains results in crosslinks. The crosslinks render the polymer less soluble in developer and creates the solubility differential with the unexposed areas necessary for image formation. Enough crosslinks render it insoluble.

The latent crosslinker of this invention may be a single compound, an oligomer, a polymer, or mixtures thereof each containing at least two —N(CH$_2$OR$^{25}$)$_a$ groups. Such crosslinking agents may be prepared by the reaction of a variety of polyamino compounds with formaldehyde in the presence of alcohols such as methanol or butanol or in other solvents followed by an etherification step. Examples of suitable polyamino compounds include ureas, melamines, benzoguanamines, glycolurils, diguanamines, as described in U.S. Pat. No. 5,545,702, and guanidines.

Examples of suitable classes of such latent crosslinkers include but are not limited to the alkoxymethylmelamines, the alkoxymethylglycolurils, the alkoxymethylbenzoguanamines, the alkoxymethyldiguanamines derived from diguanamines as described in U.S. Pat. No. 5,545,702, and melamine or benzoguanamine polymers as described in U.S. Pat. No. 6,524,708. Specific examples of compounds having multiple —N—(CH$_2$—OR$^{25}$)$_a$ units include but are not limited to:

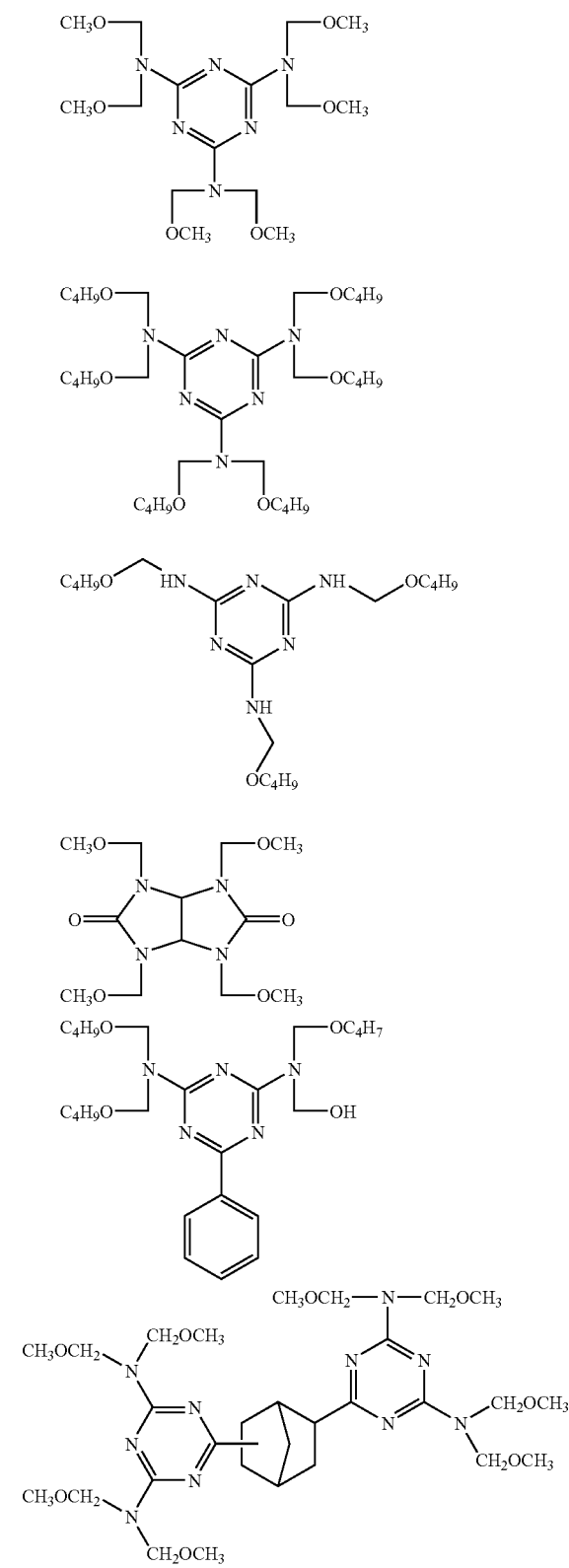

Materials having —N—(CH$_2$—OR$^{25}$)a units are available commercially from Cytec Industries, and Solutia as the Cymel™, Powderlink™, and Resimene™ series of products.

The negative working photosensitive composition can also contain additives. Examples of suitable additives include, but are not limited to, dyes, surfactants, dissolution rate modifiers, and adhesion promoters.

The polybenzoxazole precursor polymer(s), the photoactive agent(s), and the crosslinker(s) are dissolved in a solvent(s) to prepare the negative working, photosensitive composition of this invention. The solvent should not interfere with the photoacid generation from PAG or with the acid-catalyzed crosslinking reaction, should dissolve all components and should cast a good film. Suitable solvents include, but are not limited to, polar organic solvents, such as gamma-butyrolactone (GBL), propylene glycol methyl ether acetate (PGMEA), methoxy ethyl ether and mixtures thereof. The preferred solvent is gamma-butyrolactone.

Examples of the negative tone compositions suitable for this embodiment and components employed therein, include, but are not limited to those described in U.S. Pat. No. 6,924,841, and U.S. Patent Publication No. 2004/0253537, all incorporated herein by reference.

Subsequent to the bake step, the resulting film is exposed to actinic rays in a preferred pattern through a mask. X-rays, electron beam, ultraviolet rays, visible light, and the like can be used as actinic rays. The preferred rays are those with wavelength of 436 nm (g-line), 365 nm (i-line) and 248. The most preferred rays are those with wavelength of 248 nm and 365 nm.

Following exposure to actinic radiation, the exposed and coated substrate is heated to a temperature between about 70° C. and about 150° C. The exposed and coated substrate is heated in this temperature range for a short period of time, typically several seconds to several minutes and may be carried out using any suitable heating means. Preferred means include baking on a hot plate or in a convection oven. This process step is commonly referred to in the art as post exposure baking.

The process of this embodiment may be employed to produce electronic components such as semiconductor devices and multi-layered interconnections boards.

The following examples are provided to illustrate the principles and practice of the present invention more clearly. It should be understood that the present invention is not limited to the examples described. Unless otherwise stated, all percentages are percent by weight. All pretreatment compositions containing compounds of Structure VI were filtered using a 0.2 µm, Teflon, membrane filter or an encapsulated filter such as an Ultradyne filter capsule before use.

SYNTHESIS EXAMPLE 1

Synthesis of Polybenzoxazole Precursor Polymer of Structure (Ia)

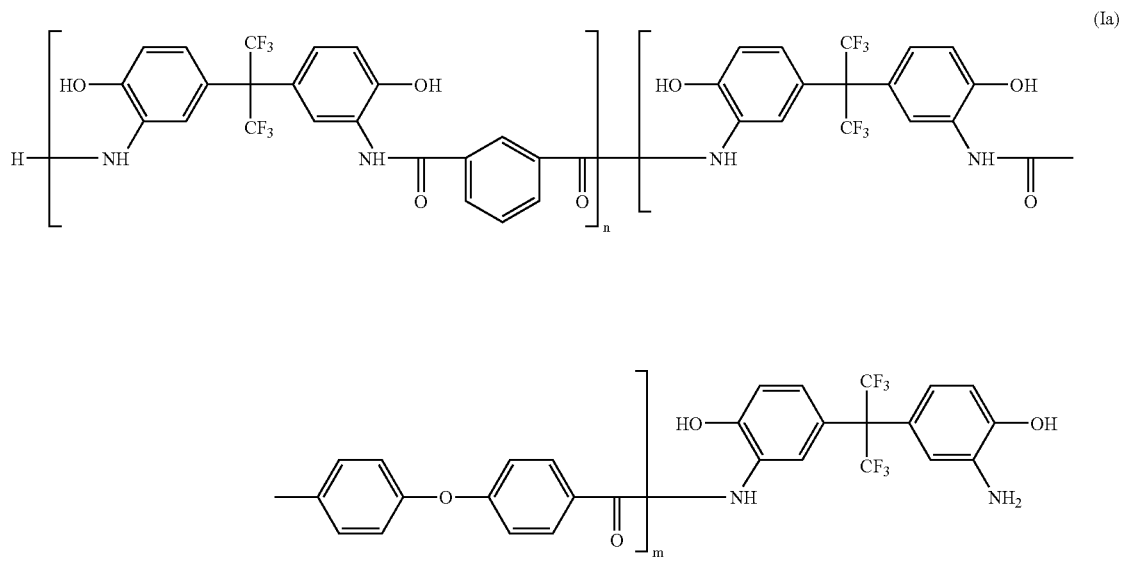

To a 2 liter, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane, 64.3 g (794.9 mmol) of pyridine, and 637.5 g of N-methylpyrrolidone (NMP) were added. The solution was stirred at room temperature until all solids dissolved, then cooled in an ice water bath at 0-5° C. To this solution, 39.3 g (194 mmol) of isophthaloyl chloride, and 56.9 g (194 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred deionized water. The polymer was collected by filtration and washed with deionized water and a water/methanol (50/50) mixture. The polymer was dried under vacuum conditions at 105° C. for 24 hours.

The yield was almost quantitative and the inherent viscosity (iv) of the polymer was 0.20 dl/g measured in NMP at a concentration of 0.5 g/dl at 25° C.

SYNTHESIS EXAMPLE 2

Synthesis of Polybenzoxazole Precursor Polymer of Structure (IIa)

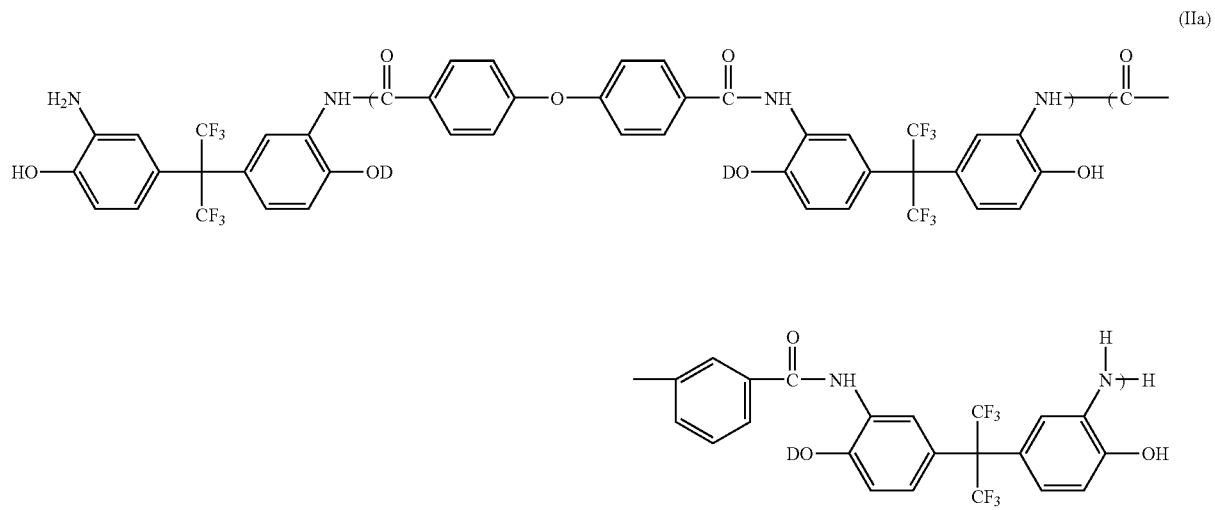

(IIa)

To a 1 liter three-necked round bottom flask equipped with a mechanical stirrer, 54.2 g (100 mmol) of the polymer obtained in Synthesis Example 1 and 500 ml of tetrahydrofuran (THF) were added. The mixture was stirred for ten minutes and the solid was fully dissolved. 0.81 g (3 mmole) of 5-naphthoquinone diazide sulfonyl chloride was then added and the mixture was stirred for another 10 minutes. Triethylamine, 0.3 g (3 mmol), was added gradually within 15 minutes and then the reaction mixture was stirred for 5 hours. The reaction mixture was then added gradually to 5000 ml of vigorously stirred deionized water. The precipitated product was separated by filtration and washed with 2 liters of deionized water. To the product was added another 6 liters deionized water and the mixture vigorously stirred for 30 minutes. After filtration the product was washed with 1 liter deionized water. The isolated product was dried at 40° C. overnight. The inherent viscosity of the polymer was 0.21 dl/g measured in NMP at the concentration of 0.5 g/dl at 25° C.

SYNTHESIS EXAMPLE 3

Synthesis of a Photoactive Compound PAC A

To a 500 ml, 3-neck flask equipped with mechanical stirrer, dropping funnel, pH probe, thermometer and nitrogen purge system were added 225 ml of THF and 30 g of (4,4'-(1-phenylethylidene)bisphenol), Bisphenol AP. The mixture was stirred until bisphenol AP was fully dissolved. To this was added 27.75 g of 4-naphthoquinone diazide sulfonyl chloride (S214-CI) and 25 ml of THF. The reaction mixture was stirred until the solid was fully dissolved. 10.48 g of triethylamine dissolved in 50 ml THF was added to the reaction mixture gradually while the pH was kept under 8 during this process. The temperature during this exothermic reaction was kept under 30° C. Upon completion of addition, the reaction mixture was stirred for 48 hours. To this was added 27.75 g of 5-naphthoquinone diazide sulfonyl chloride (S215-CI) and 25 ml of THF and the reaction mixture was stirred for 30 minutes. 10.48 g triethylamine dissolved in 50 ml THF was added to the reaction mixture gradually while the pH was kept under 8 during this process. Again during this exothermic reaction the temperature was kept under 30° C. Upon completion of the addition, the reaction mixture was stirred for 20 hours. The reaction mixture was then added gradually to a mixture of 6 liters of DI-water and 10 g of HCl. The product was filtered and washed with 2 liters of deionized water. The product was then reslurried by using 3 liters of deionized water, filtered and washed with 1 liter of deionized water. The product was then dried inside a vacuum oven at 40° C. until the amount of water dropped below 2%. HPLC analysis revealed that the product was a mixture of several esters as shown in Table 1.

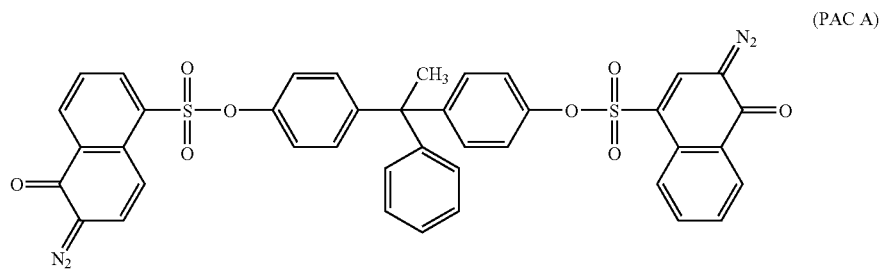

(PAC A)

TABLE 1

| Structure | DNQ moiety | Example 3 |
|---|---|---|
| | S214 | 0.61% |
| | S215 | 0.53% |
| | S214 monoester | 1.72% |
| | S215 monoester | 1.4% |
| | S215 diester | 18.9% |
| | Mixed Ester PAC | 46.7% |

TABLE 1-continued

| Structure | DNQ moiety | Example 3 |
|---|---|---|
| | S214 diester | 29% |

SYNTHESIS EXAMPLE 4

Synthesis of a Photoactive Compound PAC B

PAC B

The reaction was similar to that of Synthesis Example 3 except that only 5-naphthoquinone diazide sulfonyl chloride was used. HPLC analysis revealed that about 94% of the product was diester and 6% was monoester.

FORMULATION EXAMPLE 1

A positive acting photosensitive composition was prepared from 100 parts of a polymer prepared by the method described in Synthesis Example 2, 1.53 parts of gamma-ureidopropyltrimethoxysilane, 2.48 parts of diphenylsilanediol, and 13.51 parts of the PAC synthesized in Synthesis Example 3 and 175 parts GBL and filtered.

EXAMPLES 1-9 AND COMPARATIVE EXAMPLES 1

In Examples 1-9 and Comparative Example 1 a copper-coated wafer was first pretreated with a composition containing 2-mercaptoethyl sulfide and gamma-butyrolactone (GBL) except for the wafer employed in Comparative Example 1, which received no pretreatment. The copper-coated wafer was treated for about 10 seconds with 3 ml of the composition applied in a stream while spinning at 200 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 1 and hotplate baked for 4 minutes at 120° C., resulting in a film thickness of 11 μm. The film was then exposed utilizing an i-line stepper with a patterned exposure array, which incrementally increased the exposure energy by 30 mJ/cm² after each exposure with a starting exposure energy of 300 mJ/cm². The film was then developed using two 30 second puddles with a 2.38% aqueous tetramethyl ammonium hydroxide (TMAH) solution and rinsed with deionized water to provide a relief pattern. After drying, the wafer was then inspected visually for residue in the areas where the photosensitive composition had been removed. The results are reported in Table 2.

TABLE 2

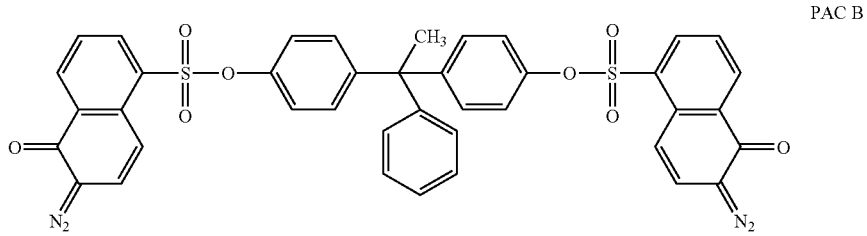

2-mercaptoethyl sulfide

| Example # | Wt % of 2-mercaptoethyl sulfide in pretreatment composition | Wt % of GBL in pretreatment composition | Residue After Patterning |
|---|---|---|---|
| 1 | 10 | 90 | No |
| 2 | 7.5 | 92.5 | No |
| 3 | 5 | 95 | No |
| 4 | 4 | 96 | No |
| 5 | 3 | 97 | No |
| 6 | 1.5 | 98.5 | No |
| 7 | 0.8 | 99.2 | No |
| 8 | 0.4 | No | No |
| 9 | 0.2 | 99.8 | No |
| Comparative Example 1 | No pretreatment | | Yes |

FORMULATION EXAMPLE 2

A positive acting photosensitive composition was prepared from 100 parts of a polymer prepared by the method described in Synthesis Example 2, 3 parts of gamma-ureidopropyltrimethoxysilane, 5 parts of diphenylsilanediol, and 11.9 parts of the PAC synthesized in Synthesis Example 4 and 175 parts GBL and filtered.

EXAMPLES 10-16 AND COMPARATIVE EXAMPLES 2-4

In Examples 10-16 and Comparative Examples 2-4 a copper-coated wafer was first pretreated with a composition containing 2-mercaptoethyl sulfide and GBL except for the wafer employed in Comparative Example 4, which received no pretreatment. The copper-coated wafer was treated for about 10 seconds with 3 ml of the composition applied in a stream while spinning at 200 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 2 and hotplate baked for 4 minutes at 120° C., resulting in a film thickness of 11 μm. The film was then exposed utilizing an i-line stepper with a patterned exposure array, which incrementally increased the exposure energy by 30 mJ/cm² after each exposure with a starting exposure energy of 300 mJ/cm². The film was then developed using two 30 second puddles with a 2.38% aqueous TMAH solution and rinsed with deionized water to provide a relief pattern. After drying, the wafer was then inspected visually for residue in the areas where the photosensitive composition had been removed. The results are reported in Table 3.

TABLE 3

| Example # | Wt % of 2-mercaptoethyl sulfide in pretreatment composition | Wt % of GBL in pretreatment composition | Residue After Patterning |
|---|---|---|---|
| 10 | 10 | 90 | No |
| 11 | 7.5 | 92.5 | No |
| 12 | 5 | 95 | No |
| 13 | 4 | 96 | No |
| 14 | 3 | 97 | No |
| 15 | 1.5 | 98.5 | No |
| 16 | 0.8 | 99.2 | No |
| Comparative Example 2 | 0.4 | 99.6 | Yes |
| Comparative Example 3 | 0.2 | 99.8 | Yes |
| Comparative Example 4 | No pretreatment | | Yes |

SYNTHESIS EXAMPLE 5

Preparation of Polybenzoxazole Precursor Polymer of Structure (IIIa)

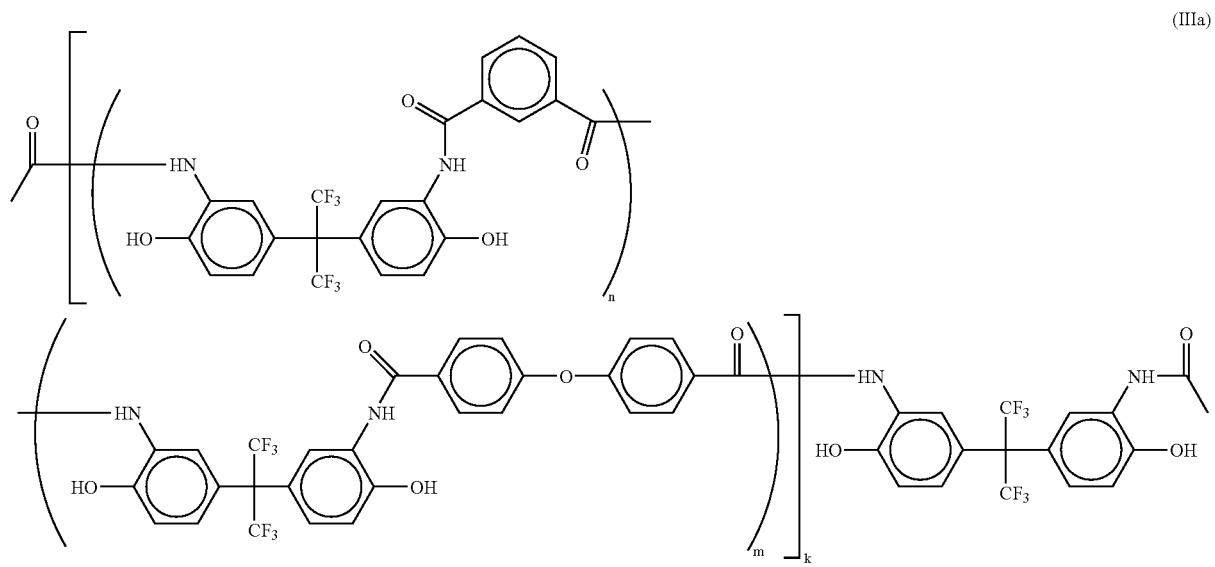

(IIIa)

100 g of the PBO precursor polymer obtained following the procedure from Synthesis Example 1 was dissolved in 1000 g of diglyme. Residual water was removed as an azeotrope with diglyme using a rotary evaporator at 65° C. (10-12 torr). About 500 g of solvents was removed during the azeotropic distillation. The reaction solution was placed under a $N_2$ blanket, equipped with a magnetic stirrer and cooled using an ice bath down to ~5° C. 3.6 g acetyl chloride was added via syringe. The reaction was held on the ice bath for about 10 min. Then the ice bath was removed and the reaction was allowed to warm up over the period of 1 hr. Then, the mixture was again cooled to 5° C. on the ice bath. 3.6 g pyridine was added via syringe over the period of 1 hr. The reaction was kept on the ice bath for ~10 min following the pyridine addition, and then was allowed to warm up over the period of 1 hr.

The reaction mixture was precipitated into 6 liters of water with stirring. The precipitated polymer was collected by filtration and air dried overnight. Then, the polymer was dissolved in 500-600 g of acetone and precipitated into 6 liters of water/methanol (70/30). The polymer was again collected by filtration and air-dried for several hours. The still damp polymer cake was dissolved in a mixture of 700 g of THF and 70 ml of water. An ion exchange resin UP604 (40 g), available from Rohm and Haas, was added and the solution was rolled for 1 hr. The final product was precipitated in 7 liters of water, filtered, air-dried overnight followed by 24 hr drying in a vacuum oven at 90° C.

The yield was 100% and the inherent viscosity (iv) of the polymer was 0.205 dl/g measured in NMP at a concentration of 0.5 g/dl at 25° C.

SYNTHESIS EXAMPLE 6

Preparation of 4,4'-Oxydiphthalic Anhydride (ODPA)/Oxydianiline (ODA) Polyamic Acid

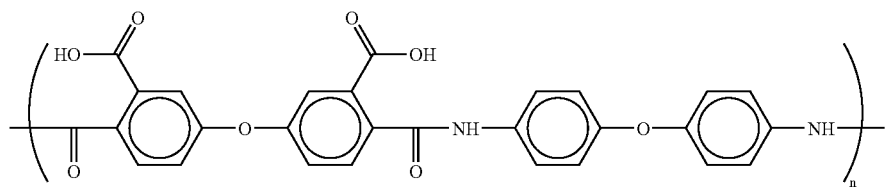

ODPA/ODA

A 500 ml, three neck, round bottom flask was equipped with a mechanical stirrer, temperature controller and nitrogen inlet. 270 g of gamma-butyrolactone was added to this reaction flask followed by addition of 31.022 g (100 mmol) of 4,4'-oxydiphthalic anhydride (ODPA). The ODPA charging funnel was rinsed with 15 g of gamma-butyrolactone. The reaction mixture was stirred at room temperature for 15 minutes and then at 73-75° C. until 4,4'-oxydiphthalic anhydride was fully dissolved. The clear, pale yellow reaction solution was cooled to 15° C. The 4,4'-oxydiphthalic anhydride was partially precipitated. 19.62 g (98 mmol) of oxydianiline was added portion wise over the period of an hour. The oxydianiline container was rinsed with 13.3 g gamma-butyrolactone, which was then added to the reaction solution in one portion. The reaction temperature was kept at 15° C. for another 15 minutes and then slowly increased to 40° C. The reaction mixture was allowed to stir at this temperature for 24 hours. The reaction was complete as evidenced by the absence of an anhydride peak (1800 cm$^{-1}$) from the IR spectrum of the solution. The viscosity of the final product was 1384 cSt.

FORMULATION EXAMPLE 3

A negative acting photosensitive composition was prepared from 100 parts of a polymer prepared by the method described in Synthesis Example 5, 5 parts of polyamic acid prepared by the method described in Synthesis Example 6, 3 parts of triethoxysilylpropyl ethoxycarbamate, 10 parts of poly-T 305 (reaction product of 2-oxepanone with 2-ethyl-2-(hydroxymethyl)-1,3-propanediol commercially available from Arch Chemicals Inc.), and 5 parts of (5-propylsulfonyloxyimino-5H-thiophen-2-ylidene)-2-methylphenyl-acetonitrile, 10 parts of Powderlink® 1174 and 180 parts GBL and filtered.

EXAMPLES 17-19 AND COMPARATIVE EXAMPLE 5

In Examples 17-19 and Comparative Example 5 a copper-coated wafer was first pretreated with a composition containing 2-mercaptoethyl sulfide and GBL except for the wafer employed in Comparative Example 5, which received no pretreatment. The copper-coated wafer was treated for about 10 seconds with 3 ml of the composition applied in a stream while spinning at 200 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 3 and hotplate baked for 4 minutes at 120° C., resulting in a film thickness of 11 μm. The film was then exposed utilizing an i-line stepper with a patterned exposure array, which incrementally increased the exposure energy by 30 mJ/cm$^2$ after each exposure with a starting exposure energy of 250 mJ/cm$^2$. The wafer was then baked at 120° C. for 3 minutes. The film was then developed using two 60 second puddles with a 2.38% aqueous TMAH solution and rinsed with deionized water to provide a relief pattern. After drying, the wafer was then inspected visually for residue in the areas where the photosensitive composition had been removed. The results are reported in Table 4

TABLE 4

| Example # | Wt % of 2-mercaptoethyl sulfide in pretreatment composition | Wt % of GBL in pretreatment composition | Residue After Patterning |
| --- | --- | --- | --- |
| 17 | 5 | 95 | ~200–300 Å* |
| 18 | 3 | 97 | ~200–300 Å* |
| 19 | 1 | 99 | ~200–300 Å* |
| Comparative Example 5 | No pretreatment | | Yes, several μm |

*200–300 Å residue can be removed by plasma descum methods. On the other hand, several μm residue cannot be removed.

EXAMPLE 20

A copper-coated wafer was first pretreated with a composition containing 1.5% dithiouracil and 98.5% GBL. The copper-coated wafer substrate was treated for about 10 seconds with 3 ml of the composition applied in a stream while spinning at 200 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 3 and hotplate baked for 5 minutes at 120° C., resulting in a film thickness of 11 μm. The film was then exposed utilizing an i-line stepper with a patterned exposure array, which incrementally increased the exposure energy by 25 mJ/cm$^2$ after each exposure with a starting exposure energy of 300 mJ/cm$^2$. The wafer was then baked at 120° C. for 3 minutes. The film was then developed using two 60 second puddles with a 2.38% aqueous TMAH solution and rinsed with deionized water to provide a relief pattern. After drying, the wafer was then inspected visually for residue in the areas where the photosensitive composition had been removed. There was no residue after patterning.

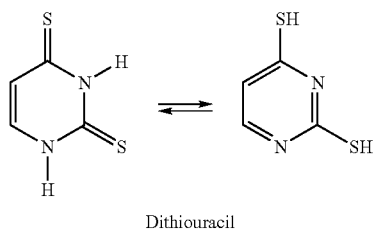

Dithiouracil

COMPARATIVE EXAMPLE 6

In Comparative Examples 6 a copper-coated wafer was first pretreated with a composition containing 3% of 1,9-nonanedithiol and 97% GBL. The copper-coated wafer was treated for about 5 seconds with 3 ml of the composition applied in a stream while spinning at 300 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 3 and hotplate baked for 5 minutes at 120° C., resulting in a film thickness of 11 µm. The film was then exposed utilizing an i-line stepper with a patterned exposure array, which incrementally increased exposure energy 25 mJ/cm² after each exposure with a starting exposure energy of 300 mJ/cm². The wafer was then post exposure baked at 120° C. for 3 minutes. The film was then developed using two 60 second puddles with an aqueous 2.38% TMAH solution and rinsed with deionized water to provide a relief pattern. After drying, the wafer was then inspected visually for residue in the areas where the photosensitive composition had been removed. There was residue remaining in this area.

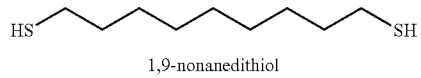

1,9-nonanedithiol

COMPARATIVE EXAMPLE 7

In Comparative Example 7 a copper-coated wafer was first pretreated with a composition containing 3% of 4-methyl-1,2-benzene dithiol and 97% GBL. The copper-coated wafer was treated for about 5 seconds with 3 ml of the composition applied in a stream while spinning at 300 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 3 and hotplate baked for 5 minutes at 120° C., resulting in a film thickness of 11 µm. The film was then exposed utilizing an i-line stepper with a patterned exposure array, which incrementally increased exposure energy 25 mJ/cm² after each exposure with a starting exposure energy of 300 mJ/cm². The wafer was then post exposure baked at 120° C. for 3 minutes. The film was then developed using two 60 second puddles with an aqueous 2.38% TMAH solution and rinsed with deionized water to provide a relief pattern. After drying, the wafer was then inspected visually for residue in the areas where the photosensitive composition had been removed. There was residue remaining in this area.

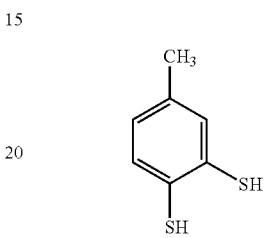

4-methyl-1,2-benzene dithiol

COMPARATIVE EXAMPLE 8

In Comparative Examples 8 a copper-coated wafer was first pretreated with a composition containing 3% of D,L-dithiothreitol and 97% GBL. The copper-coated wafer was treated for about 10 seconds with 5 ml of the composition applied in a stream while spinning at 300 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 3 and hotplate baked for 5 minutes at 120° C., resulting in a film thickness of 11 µm. The film was then exposed utilizing an i-line stepper with a patterned exposure array, which incrementally increased exposure energy 25 mJ/cm² after each exposure with a starting exposure energy of 300 mJ/cm². The wafer was then post exposure baked at 120° C. for 3 minutes. The film was then developed using two 60 second puddles with an aqueous 2.38% TMAH solution and rinsed with deionized water to provide a relief pattern. After drying, the wafer was then inspected visually for residue in the areas where the photosensitive composition had been removed. There was residue remaining in this area.

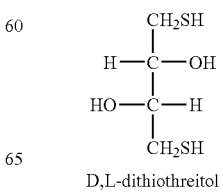

D,L-dithiothreitol

SYNTHESIS EXAMPLE 7

Preparation of a PBO Precursor Polymer III*a End Capped with an Imide Endcap (III*a)

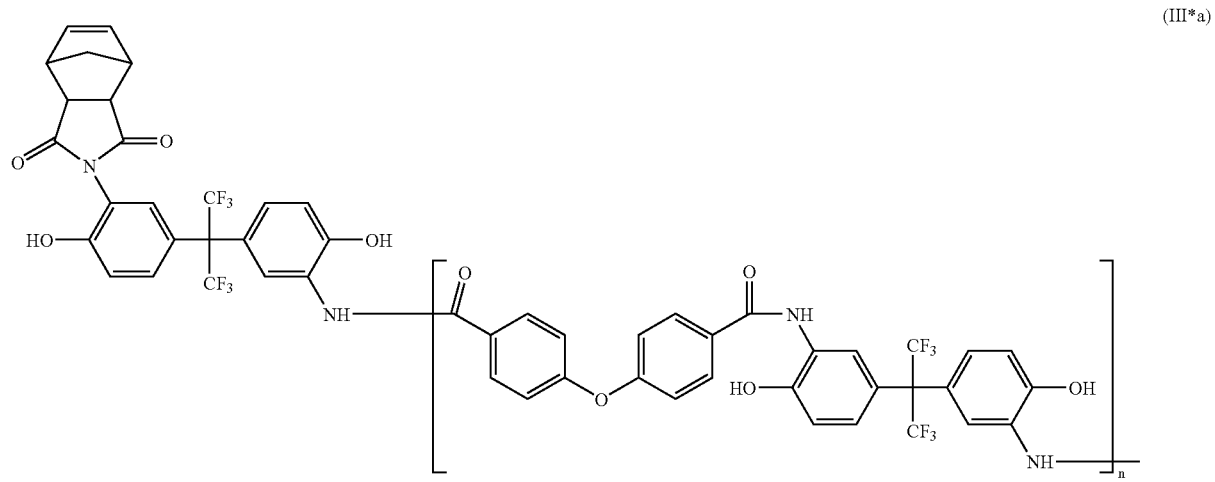

(III*a)

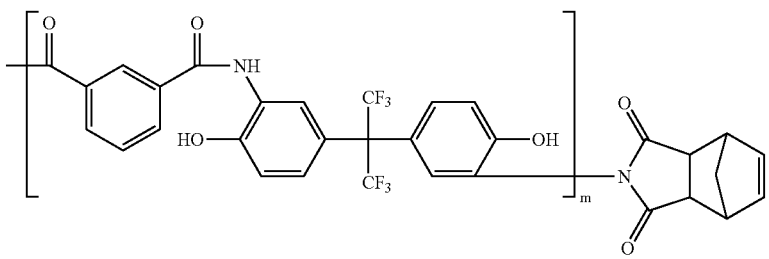

A PBO precursor polymer prepared in the same way as in Synthesis Example 1 (200 g) was dissolved in a mixture of 600 g of diglyme and 300 g of propylene glycol methyl ether acetate (PGMEA). Residual water was removed as an azeotrope with PGMEA and diglyme using a rotary evaporator at 65° C. (10-12 torr). About 550 g of solvent was removed during the azeotropic distillation. The reaction solution was placed under a $N_2$ blanket and equipped with a magnetic stirrer. Nadic anhydride (7 g) was added followed by 10 g of pyridine. The reaction was stirred overnight at 50° C. Then the reaction mixture was diluted with 500 g of tetrahydrofuran (THF) and precipitated into 8 liters of a 50:50 methanol:water mixture. The polymer was collected by filtration and vacuum dried at 80° C.

The yield was almost quantitative and the inherent viscosity (iv) of the polymer was 0.20 dl/g measured in NMP at a concentration of 0.5 g/dl at 25° C.

SYNTHESIS EXAMPLE 8

Synthesis of Polybenzoxazole Precursor Polymer of Structure (Ic)

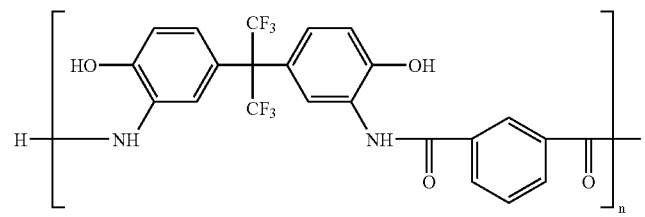

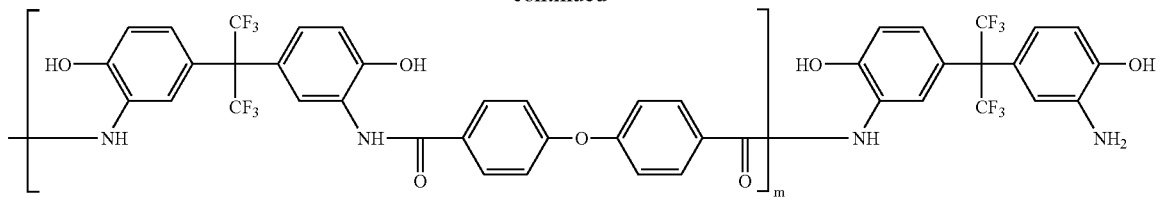

-continued

Synthesis of polymer Ic was similar to polymer Ia in Synthesis Example 1 except the ratio of 1,4-oxydibenzoyl chloride to isophthaloyl chloride changed from 1/1 to 4/1.

SYNTHESIS EXAMPLE 9

Synthesis of Polybenzoxazole Precursor Polymer of Structure (IIc)

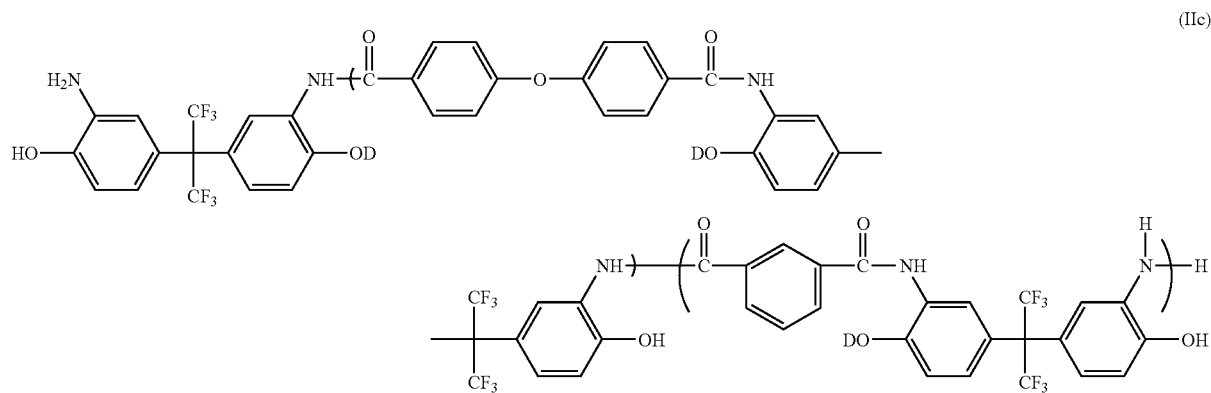

Synthesis of polymer IIc was similar to polymer IIa in Synthesis Example 2, except polymer Ic was used instead of polymer Ia and the ratio of 5-naphthoquinone diazide sulfonyl chloride to OH group was changed from 1.5% to 1%.

SYNTHESIS EXAMPLE 10

Synthesis of Polybenzoxazole Precursor Polymer of Structure (IV*c)

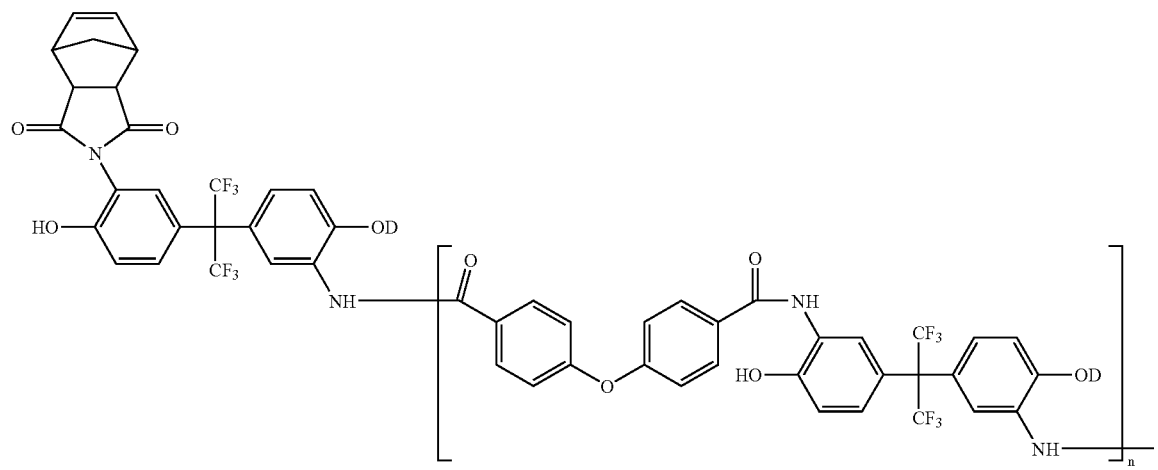

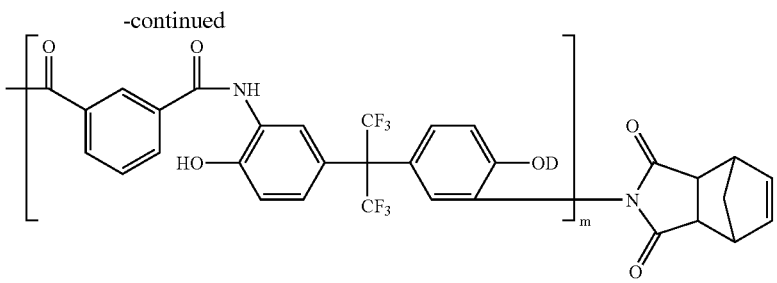

A PBO polymer prepared in the same way as in Synthesis Example 9 (200 g) was dissolved in a mixture of 600 g of diglyme and 300 g of propylene glycol methyl ether acetate (PGMEA). Residual water was removed as an azeotrope with PGMEA and diglyme using a rotary evaporator at 65° C. (10-12 torr). About 550 g of solvents was removed during the azeotropic distillation. The reaction solution was placed under a $N_2$ blanket and equipped with a magnetic stirrer. Nadic anhydride (7 g) was added followed by 10 g of pyridine. The reaction was stirred overnight at 50° C. Then the reaction mixture was diluted with 500 g of tetrahydrofuran (THF) and precipitated into 8 liters of a 50:50 methanol:water mixture. The polymer was collected by filtration and vacuum dried at 40° C. The yield was almost quantitative.

FORMULATION EXAMPLE 4

100 parts of the polymer from Synthesis Example 10, 3 parts of N-(3-triethoxysilylpropyl)maleic monoamide, 15 parts of PAC F (structure shown below) are dissolved in 170 parts GBL and 5 parts ethyl lactate and filtered.

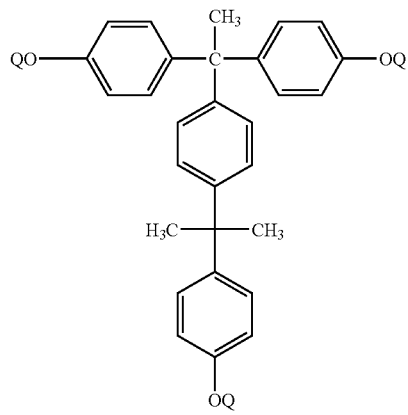

Q = H or

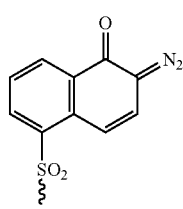

Structure of PAC F (75% of OH groups are esterified)

FORMULATION EXAMPLE 5

A positive acting photosensitive composition is prepared from 100 parts of the polymer from Synthesis Example 10, 1.5 parts of gamma-glycidoxypropyltrimethoxysilane, 20 parts of PAC J (structure shown below), 125 parts GBL, 15 parts PGMEA and 10 parts of ethyl lactate (EL) and filtered.

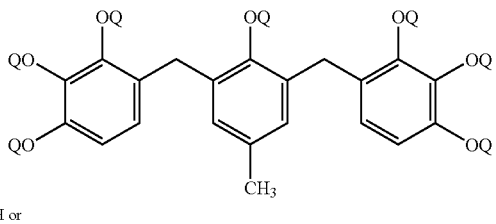

Q = H or

PAC J (50% of OH groups are esterified)

FORMULATION EXAMPLE 6

A positive acting photosensitive composition is prepared from 100 parts of a polymer prepared by the method described in Synthesis Example 2, 5 parts of diphenylsilanediol, and 11.9 parts of the PAC synthesized in Synthesis Example 4 and 175 parts GBL and filtered.

EXAMPLE 21

In Example 21 a copper-coated wafer is first pretreated with a composition containing 1.5 wt % 2-mercaptoethyl sulfide and 98.5 wt % PGMEA. The copper-coated wafer is treated for about 20 seconds with 4 ml of the composition applied as a spray while spinning at 500 rpm on a chuck in a lithographic coating tool bowl. The copper-coated wafer is then dried by accelerating the spin speed to 1000 rpm for 70 seconds.

The copper-coated wafer is then coated with the photosensitive composition of Formulation Example 4 and hotplate baked for 10 minutes at 90° C., resulting in a film thickness of 13 μm. The film is then exposed utilizing an i-line stepper with a patterned exposure array, which incrementally increases the exposure energy by 30 mJ/cm$^2$ after each exposure with a starting exposure energy of 300 mJ/cm$^2$. The film is then developed using two 50 second puddles with a 2.38% aqueous TMAH solution and rinsed with deionized water to provide a relief pattern. After drying, the wafer is then inspected visually for residue in the areas where the photosensitive composition has been removed. There is no residue after patterning.

EXAMPLE 22

In Example 22 a copper-coated wafer is first pretreated with a composition containing 2.0 wt % dithiouracil, 0.5 wt % 3-methacryloxypropyltrimethoxysilane, 80 wt % PGMEA and 17.5 wt % GBL. The copper-coated wafer is treated for about 80 seconds with 20 ml of the composition applied in a stream while spinning at 700 rpm on a chuck in a lithographic coating tool bowl. The copper-coated wafer is then dried by accelerating the spin speed to 2800 rpm for 40 seconds.

The copper-coated wafer is then coated with the photosensitive composition of Formulation Example 6 and hotplate baked for 6 minutes at 110° C., resulting in a film thickness of 10 µm. The film is then exposed utilizing an i-line stepper with a patterned exposure array, which incrementally increases the exposure energy by 30 mJ/cm² after each exposure with a starting exposure energy of 300 mJ/cm². The coated, exposed film is then baked at 110° C. for 4 minutes, developed for 95 seconds under a continuous spray of a 2.38% aqueous TMAH solution and rinsed with deionized water to provide a relief pattern. After drying, the wafer is then inspected visually for residue in the areas where the photosensitive composition has been removed. There is no residue after patterning.

EXAMPLE 23

In Example 23 a copper-coated wafer is first pretreated with a composition containing 2.5 wt % dithiouracil, 80 wt % PGMEA, 10.0 wt % GBL and 7.5 wt % ethyl lactate. The copper-coated wafer is then placed in a wafer boat and immersed for 20 seconds into a bath containing the pretreatment composition at 20° C. The wafer boat is removed from the bath and the pretreatment composition allowed to drain off the wafer and the wafer boat. The boat is then placed in a spin drier and spun at 1000 rpm for 60 seconds to dry.

The copper-coated wafer is then coated with the photosensitive composition of Formulation Example 5 and hotplate baked for 5 minutes at 115° C., resulting in a film thickness of 12.5 µm. The film is then exposed utilizing an i-line stepper with a patterned exposure array, which incrementally increases the exposure energy by 30 mJ/cm² after each exposure with a starting exposure energy of 300 mJ/cm². The coated, exposed film is then baked at 120° C. for 3 minutes, developed for 110 seconds under a continuous spray of a 2.38% aqueous TMAH solution and rinsed with deionized water to provide a relief pattern. After drying, the wafer is then inspected visually for residue in the areas where the photosensitive composition has been removed. There is no residue after patterning.

EXAMPLE 24

In Example 24 a copper-coated wafer is first pretreated with a composition containing 1.5 wt % 4,4'-dimercaptodiphenyl ether and 98.5 wt % PGMEA. The copper-coated wafer is treated for about 15 seconds with 4 ml of the composition applied in a stream while spinning at 250 rpm on a chuck in a lithographic coating tool bowl. The copper-coated wafer is then dried by accelerating the spin speed to 2000 rpm for 60 seconds.

The copper-coated wafer is then coated with the photosensitive composition of Formulation Example 2 and hotplate baked for 3 minutes at 120° C., resulting in a film thickness of 11 µm. The film is then exposed utilizing an i-line stepper with a patterned exposure array, which incrementally increases the exposure energy by 30 mJ/cm² after each exposure with a starting exposure energy of 300 mJ/cm². The film is then developed using two 30 second puddles with a 2.38% aqueous TMAH solution and rinsed with deionized water to provide a relief pattern. After drying, the wafer is then inspected visually for residue in the areas where the photosensitive composition has been removed. There is no residue after patterning.

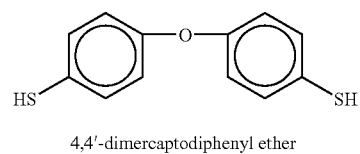

4,4'-dimercaptodiphenyl ether

SYNTHESIS EXAMPLE 11

Preparation of a PBO Precursor Polymer End Capped with a p-toluene Sulfonic Group, Structure IIIa'

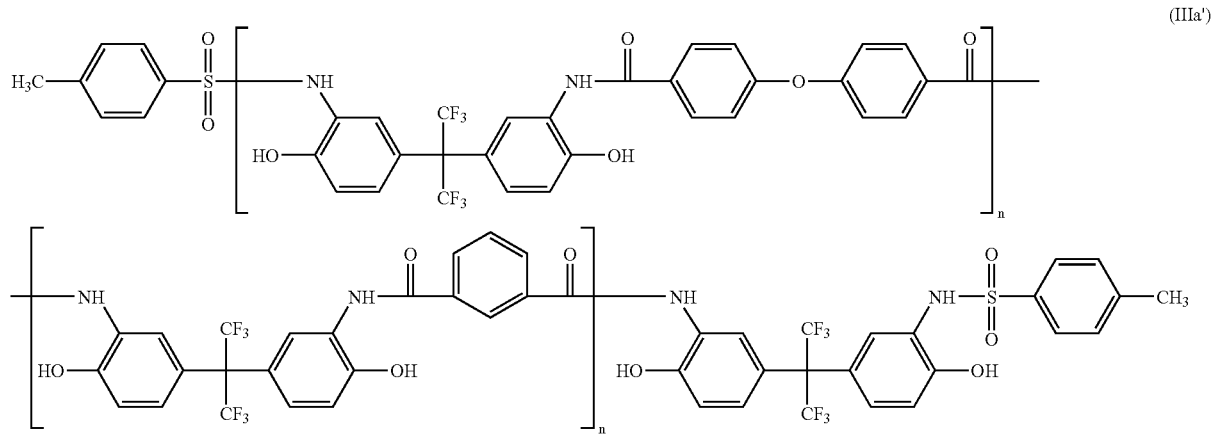

A PBO precursor polymer prepared in the same way as in Synthesis Example 1 (100 g) was dissolved in a mixture of 500 g of diglyme and 300 g of propylene glycol methyl ether acetate (PGMEA). Residual water was removed as an azeotrope with PGMEA and diglyme using vacuum distillation at 65° C. (10-12 torr). About 400 g of solvents were removed during the azeotropic distillation. The reaction solution was placed under a $N_2$ blanket. The reaction mixture was cooled on an ice batch down to 5° C. and 3.2 g of pyridine was added at once followed by 8.5 g of p-toluene sulfonic acid chloride. The reaction mixture was warmed up to room temperature and stirred overnight.

The reaction mixture was precipitated into 6 liters of water with stirring. The precipitated polymer was collected by filtration and air dried overnight. Then, the polymer was dissolved in 500-600 g of acetone and precipitated into 6 liters of water/methanol (70/30). The polymer was again collected by filtration and air-dried for several hours. The still damp polymer cake was dissolved in a mixture of 700 g of THF and 70 ml of water. An ion exchange resin UP604 (40 g), available from Rohm and Haas, was added and the solution was rolled for 1 hr. The final product was precipitated in 7 liters of water, filtered, air-dried overnight followed by 24 hr drying in vacuum oven at 90° C.

$^1$H NMR analysis showed the absence of any amine peaks at ~4.5 ppm as well as the absence of aromatic peaks due to the uncapped hexafluoro-2,2-bis(3-amino-4-hydroxyphenyl)propane unit at 6.4-6.7 ppm. This indicated that end capping was complete. Yield: 77 g

FORMULATION EXAMPLE 7

A photosensitive formulation is prepared by mixing together 100 parts by weight of a PBO precursor polymer, prepared in the same way as in Synthesis Example 11, 100 parts of GBL, 100 parts of NMP (N-methylpyrolidone), 5 parts of PAG 2 (shown below), 3 parts of beta-(3,4-epoxycyclohexyl)ethyltrimethoxysilane and 10 parts of Cymel 303.

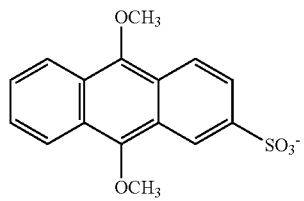

PAG 2

EXAMPLE 25

A copper-coated wafer is first pretreated with a composition containing 4 wt % of 2-mercaptoethyl sulfide, 80 wt % GBL and 16 wt % PGMEA. The copper-coated wafer is placed in a wafer boat and immersed for 20 seconds into a bath containing the 2-mercaptoethyl sulfide composition at 30° C. The wafer boat is removed from the bath and the 2-mercaptoethyl sulfide composition allowed to drain off the wafer and the wafer boat. The boat is then placed in a spin drier and spun at 2000 rpm for 60 seconds to dry.

The copper-coated wafer is then coated with the photosensitive composition of Formulation Example 7 and hotplate baked for 5 minutes at 115° C., resulting in a film thickness of 12.5 μm. This film is exposed portion wise using incremental exposures on a Cannon 3000i4 exposure tool starting at 50 mJ/cm$^2$ incrementing the exposure dose by 50 mJ/cm$^2$. The coated, exposed film is then baked at 120° C. for 3 min, developed for 95 seconds under a continuous spray of 0.262N aqueous TMAH solution, and rinsed with deionized water to provide a relief pattern. After drying, the wafer is then inspected visually for residue in the areas where the photosensitive composition has been removed. There is no residue after patterning.

EXAMPLE 26

In Example 26 a copper-coated wafer is first pretreated with a composition containing 2 wt % 4,4'-thiobenzenethiol, 80 wt % GBL and 18 wt % NMP. The copper-coated wafer is treated for about 20 seconds with 5 ml of the composition applied in a stream while spinning at 300 rpm on a chuck in a lithographic coating tool bowl. The copper-coated wafer is then dried by accelerating the spin speed to 2800 rpm for 70 seconds.

The copper-coated wafer is then coated with the photosensitive composition of Formulation Example 7 and hotplate baked for 5 minutes at 110° C., resulting in a film thickness of 10 μm. The film is then exposed utilizing an i-line stepper with a patterned exposure array, which incrementally increases the exposure energy by 50 mJ/cm$^2$ after each exposure with a starting exposure energy of 50 mJ/cm$^2$. The film is then developed using two 50 second puddles with a 2.38% aqueous TMAH solution and rinsed with deionized water to provide a relief pattern. After drying, the wafer is then inspected visually for residue in the areas where the photosensitive composition has been removed. There is no residue after patterning.

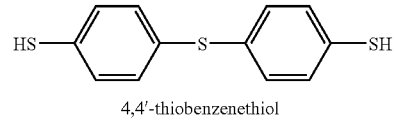

4,4'-thiobenzenethiol

FORMULATION EXAMPLE 8

A photosensitive formulation is prepared by mixing together 100 parts by weight of a PBO precursor polymer, prepared in the same way as in Synthesis Example 11, 170 parts of GBL, 30 parts of PGMEA, 5 parts of the PAG 2 shown above, and 10 parts of Cymel 303.

EXAMPLE 27

In Example 27 a copper-coated wafer is first pretreated with a composition containing 2 wt % dithiouracil, 1 wt % gamma-glycidoxypropyltrimethoxysilane, 80 wt % GBL and 18 wt % ethyl lactate. The copper-coated wafer is treated for about 12 seconds with 4 ml of the composition applied in a spray while spinning at 350 rpm on a chuck in a lithographic coating tool bowl. The copper-coated wafer is then dried by accelerating the spin speed to 2800 rpm for 70 seconds.

The copper-coated wafer is then coated with the photosensitive composition of Formulation Example 8 and hotplate baked for 3 minutes at 120° C., resulting in a film thickness of 11 μm. The film is then exposed utilizing an i-line stepper with a patterned exposure array, which incrementally increases the exposure energy by 50 mJ/cm$^2$ after each exposure with a starting exposure energy of 250 mJ/cm$^2$. The coated, exposed film is then baked at 130° C. for 3 min, developed using two 60 second puddles with a 2.38% aqueous TMAH solution and rinsed with deionized water to provide a relief pattern. After drying, the wafer is then inspected visually for residue in the areas where the photosensitive composition has been removed. There is no residue after patterning.

SYNTHESIS EXAMPLE 12

Preparation of PBO Precursor Blocked with Ethyl Vinyl Ether (III*a Blocked)

A polymer prepared in the same way as in Synthesis Example 7 (100 g) was dissolved in 1000 g of diglyme. Residual water was removed as an azeotrope with diglyme using a rotary evaporator at 65° C. (10-12 torr). About 500 g of solvent was removed during the azeotrope distillation. The reaction solution was placed under a $N_2$ blanket and equipped with a magnetic stirrer. Ethyl vinyl ether (9 ml) was added via syringe, followed by 6.5 ml of 1.5 wt % solution of p-toluene sulfonic acid in PGMEA. The reaction mixture was stirred for 4 hrs at 25° C. and triethylamine (1.5 ml) was added followed by ethyl acetate (500 ml). 250 ml of water was added and the mixture was stirred for about 30 min. Then the stirring was stopped and organic and water layers were allowed to separate. The water layer was discarded. The procedure was repeated 3 m ore times. Then, GBL (500 ml) was added and lower boiling point solvents were removed using a rotary evaporator at 60° C. (10-12 torr). The polymer was precipitated in 5 liters of water. The product was collected by filtration and was dried in a vacuum oven at 45° C. overnight.

Yield: 90 g. $^1$H NMR showed that ~17% (mol) of the OH groups in the PBO precursor were blocked with ethyl vinyl ether.

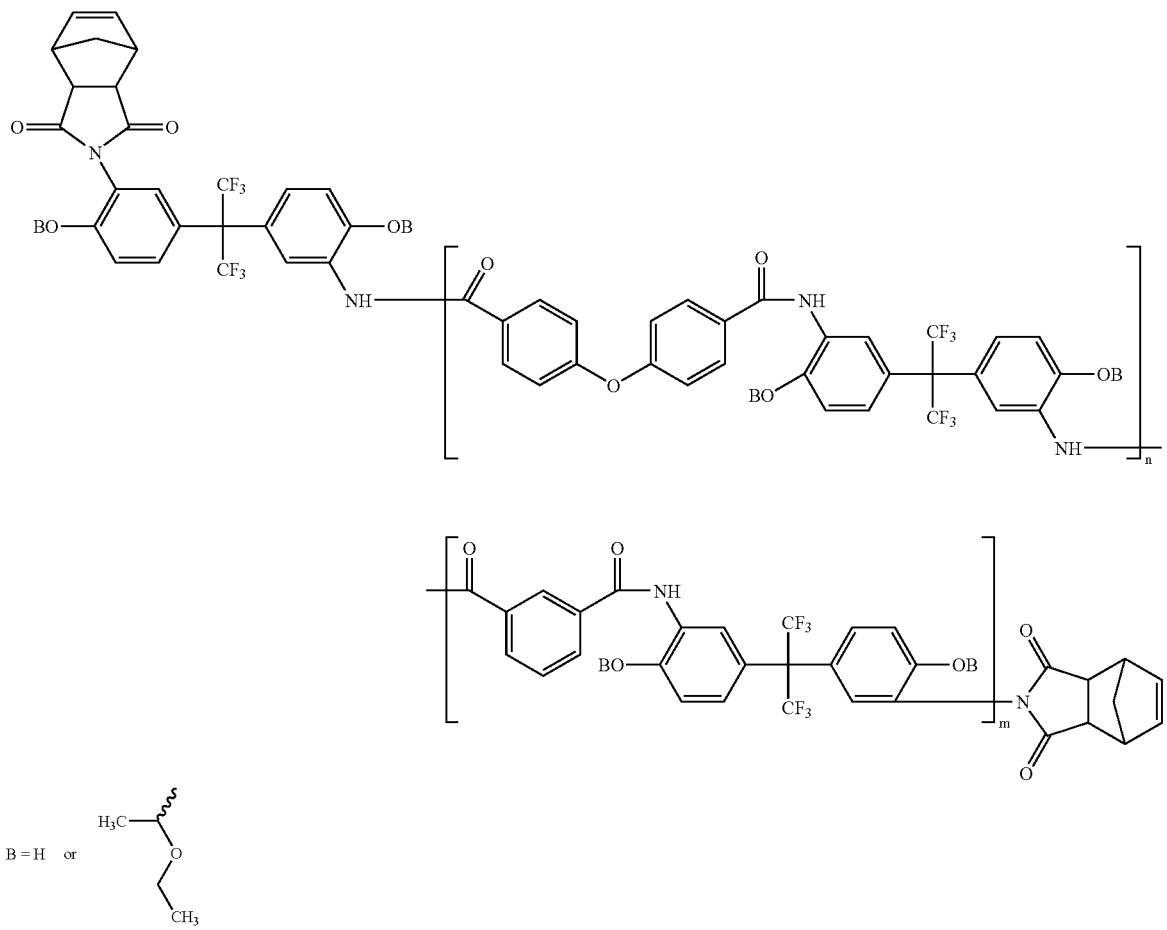

(III*a blocked)

SYNTHESIS EXAMPLE 13

Preparation of PBO Precursor Blocked with Ethyl Vinyl Ether (IIIa Blocked)

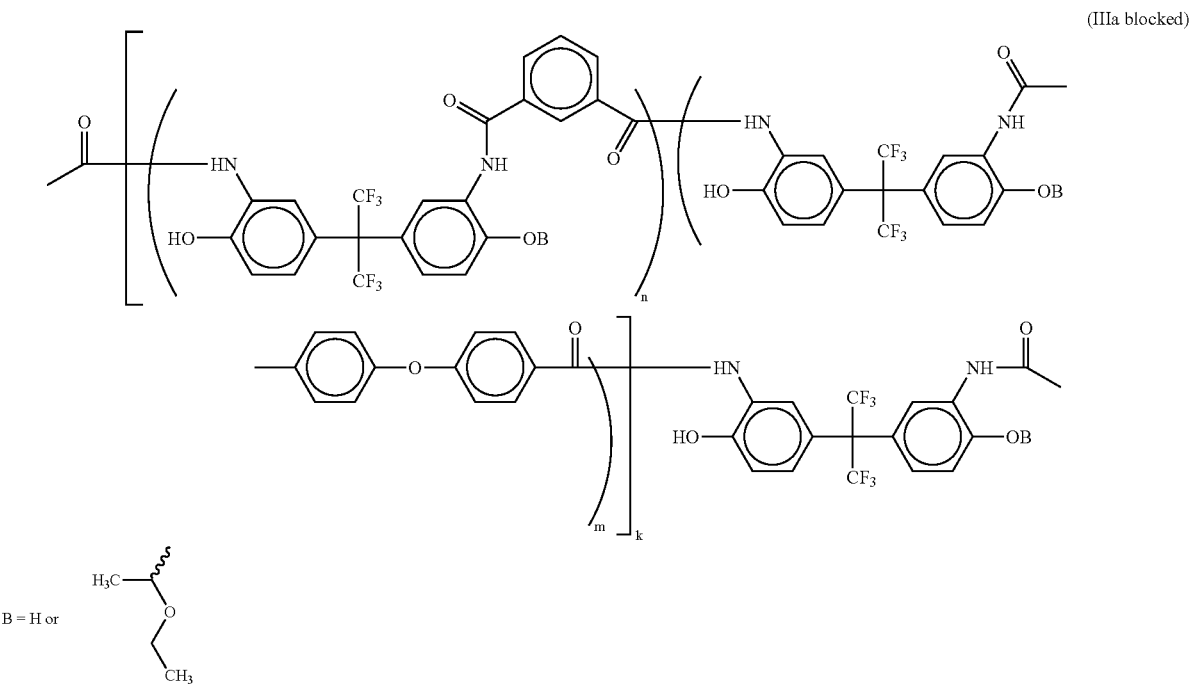

Synthesis of polymer (IIIa blocked) is similar to polymer (III*a blocked) in Synthesis Example 12, except polymer IIIa prepared by the method of Synthesis Example 5 is used as starting material.

FORMULATION EXAMPLE 9

A positive acting photosensitive composition is prepared by mixing 100 parts of a polymer prepared by the method described in Synthesis Example 13, 2.5 parts of gamma-ureidopropyltrimethoxylilane, 5 parts of PAG 2 (shown above) and 160 parts GBL and filtered.

FORMULATION EXAMPLE 10

A positive acting photosensitive composition is prepared by mixing 100 parts of a polymer prepared by the method described in Synthesis Example 12, 3.5 parts of gamma-glycidoxypropyltrimethoxysilane, and 5 parts of PAG 2 (shown above), 120 parts PGMEA and 30 parts ethyl lactate and filtered.

FORMULATION EXAMPLE 11

A positive acting photosensitive composition is prepared by mixing 100 parts of a polymer prepared by the method described in Synthesis Example 13, 5 parts of PAG 2 shown above and 160 parts GBL and filtered.

EXAMPLE 28

In Example 28 a copper-coated wafer is first pretreated with a composition containing 2.5 wt % D,L-dithiothreitol, 70 wt % PGMEA and 27.5 wt % GBL. The copper-coated wafer is treated for about 8 seconds with 2.5 ml of the composition applied in a stream while spinning at 150 rpm on a chuck in a lithographic coating tool bowl. The copper-coated wafer is then dried by accelerating the spin speed to 1500 rpm for 50 seconds.

The copper-coated wafer is then coated with the photosensitive composition of Formulation Example 9 and hotplate baked for 5 minutes at 115° C., resulting in a film thickness of 10 μm. The film is then exposed utilizing an i-line stepper with a patterned exposure array, which incrementally increases the exposure energy by 25 mJ/cm² after each exposure with a starting exposure energy of 300 mJ/cm². The coated, exposed film is then baked at 120° C. for 3 min, developed using a 80 second continuous spray with a 2.38% aqueous TMAH solution and rinsed with deionized water to provide a relief pattern. After drying, the wafer is then inspected visually for residue in the areas where the photosensitive composition has been removed. There is no residue after patterning.

EXAMPLE 29

In Example 29 a copper-coated wafer is first pretreated with a composition containing 3 wt % dithiouracil, 1.5 wt % beta-(3,4-epoxycyclohexyl)ethyltrimethoxysilane, 70 wt % PGMEA and 25.5 wt % ethyl lactate. The copper-coated wafer is treated for about 15 seconds with 5 ml of the composition applied in a stream while spinning at 200 rpm on a chuck in a lithographic coating tool bowl. The copper-coated wafer is then dried by accelerating the spin speed to 2000 rpm for 50 seconds.

The copper-coated wafer is then coated with the photosensitive composition of Formulation Example 11 and hotplate baked for 4 minutes at 125° C., resulting in a film thickness of 9 μm. The film is then exposed utilizing an i-line stepper with a patterned exposure array, which incrementally increases the exposure energy by 25 mJ/cm² after each exposure with a starting exposure energy of 300 mJ/cm². The coated, exposed film is then developed using two 60 second puddles with a 2.38% aqueous TMAH solution and rinsed with deionized water to provide a relief pattern. After drying, the wafer is then inspected visually for residue in the areas where the photosensitive composition has been removed. There is no residue after patterning.

EXAMPLE 30

In Example 30 a copper-coated wafer is first pretreated with a composition containing 3 wt % dithiouracil, 80 wt % PGMEA, 10.0 wt % GBL and 7 wt % ethyl lactate. The copper-coated wafer is then placed in a wafer boat and immersed for 30 seconds into a bath containing the pretreatment composition at 25° C. The wafer boat is removed from the bath and the pretreatment composition allowed to drain off the wafer and the wafer boat. The boat is then placed in a spin drier and spun at 2000 rpm for 80 seconds to dry.

The copper-coated wafer is then coated with the photosensitive composition of Formulation Example 10 and hotplate baked for 3 minutes at 120° C., resulting in a film thickness of 11 μm. The film is then exposed utilizing an i-line stepper with a patterned exposure array, which incrementally increases the exposure energy by 25 mJ/cm² after each exposure with a starting exposure energy of 300 mJ/cm². The coated, exposed film is then baked at 120° C. for 3 minutes, developed for 110 seconds under a continuous spray of a 2.38% aqueous TMAH solution and rinsed with deionized water to provide a relief pattern. After drying, the wafer is then inspected visually for residue in the areas where the photosensitive composition has been removed. There is no residue after patterning.

FORMULATION EXAMPLE 12

A positive acting photosensitive composition was prepared by mixing 100 parts of a polymer prepared by the method described in Synthesis Example 12, 3 parts of triethoxysilylpropyl ethoxycarbamate, and 5 parts of (5-propylsulfonyloxyimino-5H-thiophen-2-ylidene)-2-methylphenyl-acetonitrile, 5 parts tripropylglycol, 130 parts of PGMEA, and 20 parts GBL and filtered.

EXAMPLES 31-33 AND COMPARATIVE EXAMPLE 9

In Examples 31-33 and Comparative Example 9 a copper-coated wafer was first pretreated with a composition containing 2-mercaptoethyl sulfide and GBL except for the wafer employed in Comparative Example 9, which received no pretreatment. The copper-coated wafer was treated for about 10 seconds with 3 ml of the composition applied in a stream while spinning at 200 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 12 and hotplate baked for 3 minutes at 120° C., resulting in a film thickness of 9 μm. The film was then exposed utilizing an i-line stepper with a patterned exposure array, which incrementally increased the exposure energy by 25 mJ/cm² after each exposure with a starting exposure energy of 300 mJ/cm². The wafer was then post exposure baked at 130° C. for 3 minutes. The film was then developed using two 60 second puddles with a 2.38% aqueous TMAH solution. After drying, the wafer was then inspected visually for residue in the areas where the photosensitive composition had been removed. The results are reported in Table 5.

TABLE 5

| Example # | Wt % of 2-mercaptoethyl sulfide in pretreatment composition | Wt % of GBL in pretreatment composition | Residue After Patterning |
| --- | --- | --- | --- |
| 31 | 5 | 95 | No |
| 32 | 3 | 97 | No |
| 33 | 1 | 99 | No |
| Comparative Example 9 | No pretreatment | | Yes |

EXAMPLE 34

A copper-coated wafer was first pretreated with a composition containing 3% D,L-dithiothreitol and 97% GBL. The copper-coated wafer substrate was treated for about 10 seconds with 3 ml of the composition applied in a stream while spinning at 200 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 12 and hotplate baked for 3 minutes at 120° C., resulting in a film thickness of 9 μm. The film was then exposed utilizing an i-line stepper with a patterned exposure array, which incrementally increased the exposure energy by 25 mJ/cm² after each exposure with a starting exposure energy of 300 mJ/cm². The wafer was then post exposure baked at 130° C. for 3 minutes. The film was then developed using two 60 second puddles with a 2.38% aqueous TMAH solution and rinsed with deionized water to provide a relief pattern. After drying, the wafer was then inspected visually for residue in the areas where the photosensitive composition had been removed. There was no residue after patterning.

EXAMPLE 35

A copper-coated wafer was first pretreated with a composition containing 1.5% of dithiouracil and 98.5% GBL. The copper-coated wafer was treated for about 10 seconds with 3 ml of the composition applied in a stream while spinning at 200 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 12 and hotplate baked for 3 minutes at 120° C., resulting in a film thickness of 9 μm. The film was then exposed utilizing an i-line stepper with a patterned exposure array, which incrementally increased the exposure energy by 25 mJ/cm² after each exposure with a starting exposure energy of 300 mJ/cm². The wafer was then baked at 130° C. for 3 minutes. The film was then developed using two 60 second puddles with a 2.38% aqueous TMAH solution and rinsed with deionized water to provide a relief pattern. After drying, the wafer was then inspected visually for residue in the areas where the photosensitive composition had been removed. There was no residue after patterning.

COMPARATIVE EXAMPLE 10

In Comparative Example 10 a copper-coated wafer was first pretreated with a composition containing 3% of 1,9-nonanedithiol and 97% GBL. The copper-coated wafer was treated for about 5 seconds with 3 ml of the composition applied in a stream while spinning at 300 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 12 and hotplate baked for 3 minutes at 120° C., resulting in a film thickness of 9 μm. The film was then exposed utilizing an i-line stepper with a patterned exposure array, which incrementally increased exposure energy 25 mJ/cm² after each exposure with a starting exposure energy of 300 mJ/cm². The wafer was then post exposure baked at 130° C. for 3 minutes. The film was then developed using two 60 second puddles with a 2.38% aqueous TMAH solution and rinsed with deionized water to provide a relief pattern. After drying, the wafer was then inspected visually for residue in the areas where the photosensitive composition had been removed. Some residue was left in the wafer.

COMPARATIVE EXAMPLE 11

In Comparative Example 11 a copper-coated wafer was first pretreated with a composition containing 3% of 4-methyl-1,2-benzene dithiol and 97% GBL. The copper-coated wafer was treated for about 5 seconds with 3 ml of the composition applied in a stream while spinning at 300 rpm on a chuck in a lithographic coating tool bowl. The copper-coated wafer was then dried by accelerating the spin speed to 2000 rpm for 50 seconds.

The copper-coated wafer was then coated with the photosensitive composition of Formulation Example 12 and hotplate baked for 3 minutes at 120° C., resulting in a film thickness of 9 μm. The film was then exposed utilizing an i-line stepper with a patterned exposure array, which incrementally increased exposure energy 25 mJ/cm² after each exposure with a starting exposure energy of 300 mJ/cm². The wafer was then post exposure baked at 130° C. for 3 minutes. The film was then developed using two 60 second puddles with a 2.38% aqueous TMAH solution and rinsed with deionized water to provide a relief pattern. After drying, the wafer was then inspected visually for residue in the areas where the photosensitive composition had been removed. Some residue was left on the wafer.

In the pretreatment and image forming processes of this invention the substrate is preferably a substrate with copper metallization.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. A process for pretreating a substrate to be subjected to forming a relief pattern thereon by exposure to actinic radiation, the process comprising treating the substrate with a pretreatment composition prior to coating the substrate with a photosensitive composition, the pretreatment composition comprising:

(1) at least one compound having structure VI $$V^1—Y—V^2 \qquad VI$$

wherein Y is selected from the group consisting of S, O, $NR^2$, $(HOCH)_p$, and

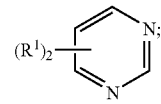

wherein each $R^1$ is independently selected from the group consisting of H, an alkyl group, an alkenyl group, an alkynyl group, an alkoxy group, and a halogen, each $R^2$ is independently selected from the group consisting of H, SH, $CH_3$, $C_2H_5$, and a linear or branched $C_1$-$C_4$ alkyl group containing a thiol group; and wherein $V^1$ and $V^2$ are independently selected from the group consisting of

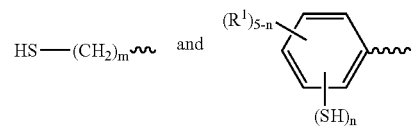

wherein, m is independently an integer from 0 to 4 with the proviso that m=0 only when Y=

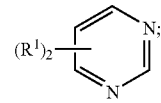

n is an integer from 1 to 5; p is an integer of from 1 to 4, and (2) at least one organic solvent;

wherein the amount of the compound of Structure VI present in the composition is effective to inhibit residue from forming when a photosensitive composition is coated on the substrate and the resulting coated substrate is subsequently processed to form an image on the substrate, with the proviso that when a polybenzoxazole precursor polymer is used in a negative working photosensitive composition, Y cannot be $(HOCH)_p$ in structure VI.

2. A process for forming a relief pattern on a substrate, the process comprising the steps of:

(a) pretreating a substrate using a pretreatment composition comprising:

(1) at least one compound having structure VI $$V^1—Y—V^2 \qquad VI$$

wherein Y is selected from the group consisting of S, O, $NR^2$, $(HOCH)_p$, and

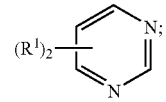

wherein each $R^1$ is independently selected from the group consisting of H, an alkyl group, an alkenyl group, an alkynyl group, an alkoxy group, and a halogen, each $R^2$ is independently selected from the group consisting of H, SH, $CH_3$, $C_2H_5$, and a linear or branched $C_1$-$C_4$ alkyl group containing a thiol group; and wherein $V^1$ and $V^2$ are independently selected from the group consisting of

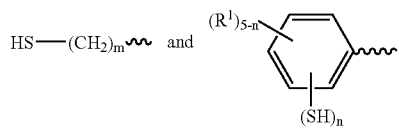

wherein, m is independently an integer from 0 to 4 with the proviso that m=0 only when Y=

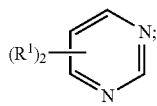

n is an integer from 1 to 5; p is an integer of from 1 to 4, and (2) at least one organic solvent;
wherein the amount of the compound of Structure VI present in the composition is effective to inhibit residue from forming when a photosensitive composition is coated on the substrate and the resulting coated substrate is subsequently processed to form an image on the substrate, (b) coating on the pretreated substrate a photosensitive composition comprising:
(1) at least one polybenzoxazole precursor polymer selected from the group consisting of
a positive working polybenzoxazole precursor polymer that does not have at least one acid labile functional group,
a positive working polybenzoxazole precursor polymer that does have at least one acid labile functional group and
a negative working polybenzoxazole precursor polymer,
wherein when the polybenzoxazole precursor polymer is a positive working polybenzoxazole precursor polymer that does not contain at least one acid labile functional group, the photosensitive composition comprises at least one diazonaphthoquinone photoactive compound; when the polybenzoxazole precursor polymer is a positive working polybenzoxazole precursor polymer that does contain at least one acid labile functional group, the photosensitive composition comprises at least one photoacid generator; and when the polybenzoxazole precursor polymer is a negative working polybenzoxazole precursor polymer Y cannot be $(HOCH)_p$ in structure VI and the photosensitive composition comprises at least one photoactive compound that releases acid upon radiation and at least one latent crosslinker, and (2) at least one solvent,
thereby forming a coated substrate,
(c) baking the coated substrate,
(d) exposing the baked coated substrate to actinic radiation, and
(e) developing the exposed coated substrate with an aqueous developer, thereby forming an uncured relief image on the coated substrate.

3. A process according to claim 2, wherein the compound having structure VI is selected from the group consisting of

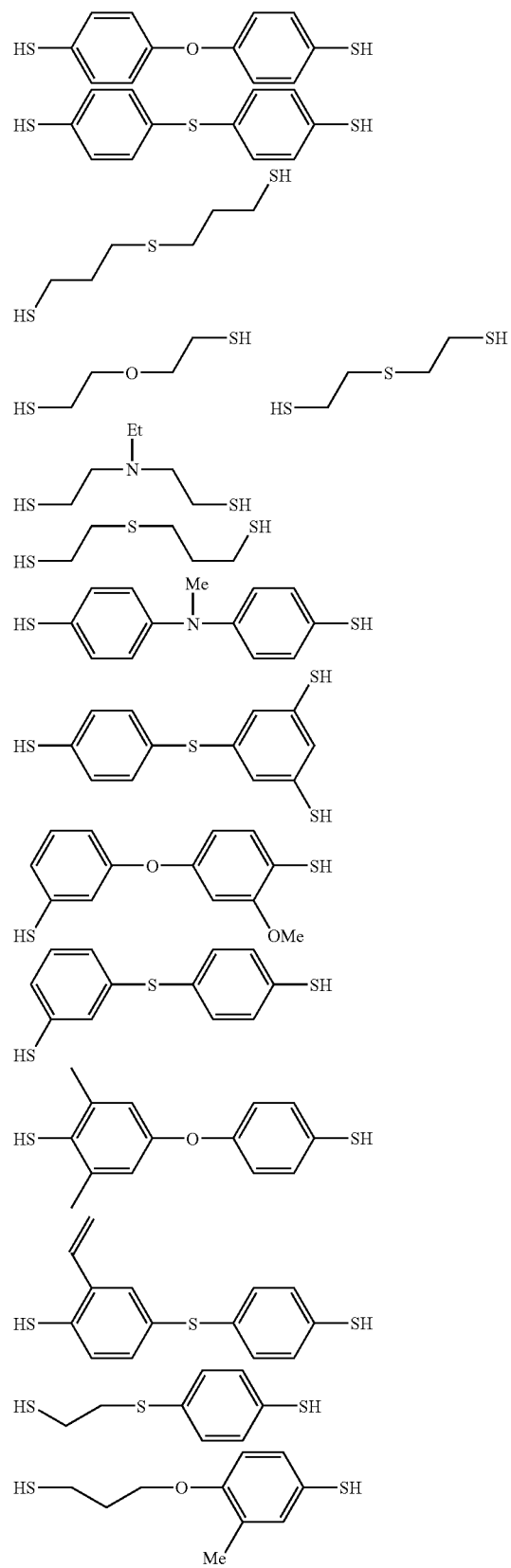

-continued

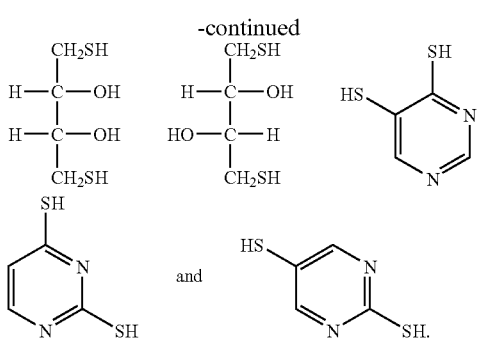

and

4. A process according to claim 2, wherein the compound having structure VI is selected from the group consisting of

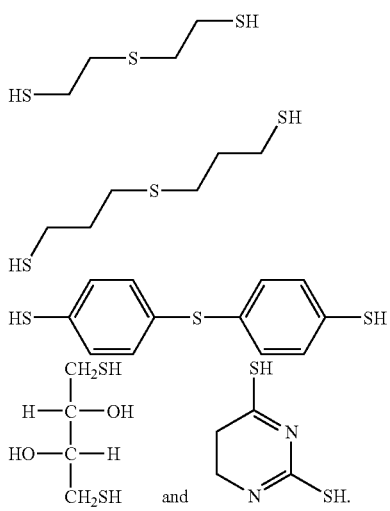

and

5. A process according to claim 2, wherein the compound having structure VI is selected from the group consisting of

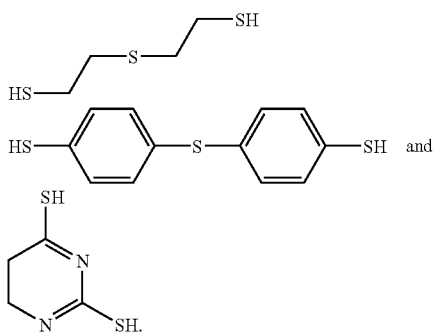

and

6. A process according to claim 2, wherein the pretreatment composition further comprises an adhesion promoter.

7. A process according to claim 6, wherein the adhesion promoter is a compound of structure XIV

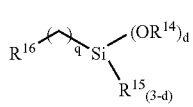

XIV wherein each $R^{14}$ is independently selected from the group consisting of a $C_1$-$C_4$ alkyl group and a $C_5$-$C_7$ cycloalkyl group, each $R^{15}$ is independently selected from the group consisting of a $C_1$-$C_4$ alkyl group, a $C_1$-$C_4$ alkoxy group, a $C_5$-$C_7$ cycloalkyl group and a $C_5$-$C_7$ cycloalkoxy group, d is an integer from 0 to 3 and q is an integer from 1 to about 6, $R^{16}$ is selected from the group consisting of

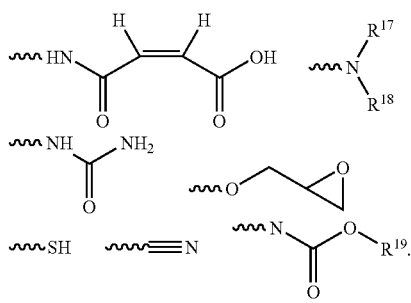

wherein each $R^{17}$ and $R^{18}$ are each independently a $C_1$-$C_4$ alkyl group or a $C_5$-$C_7$ cycloalkyl group, and $R^{19}$ is a $C_1$-$C_4$ alkyl group or a $C_5$-$C_7$ cycloalkyl group.

8. A process according to claim 2, wherein the adhesion promoter is a compound selected from the group consisting of

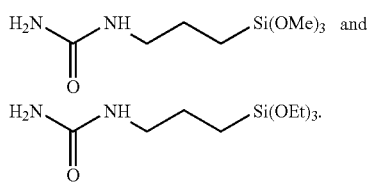

9. A process according to claim 2 wherein the at least one polybenzoxazole precursor polymer is a positive working composition comprising a polybenzoxazole precursor polymer that does not contain at least one acid labile functional group and is selected from the group consisting of polybenzoxazole precursor polymer having Structure I, II, III, III*, IV, IV* and V

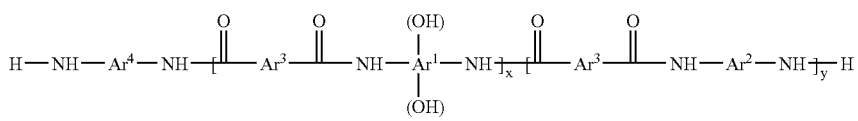

I

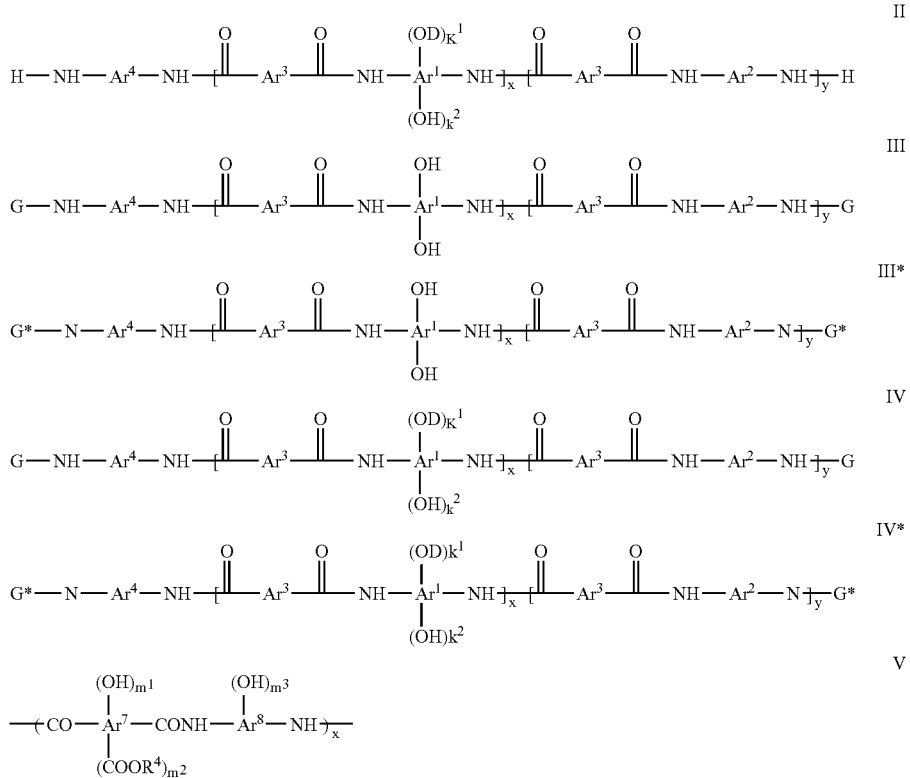

wherein Ar$^1$ is selected from the group consisting of a tetravalent aromatic group, a tetravalent heterocyclic group, and mixtures thereof; Ar$^2$ is selected from the group consisting of a divalent aromatic, a divalent heterocycic, a divalent alicyclic, and a divalent aliphatic group which may contain silicon; Ar$^3$ is selected from the group consisting of a divalent aromatic group, a divalent aliphatic group, a divalent heterocyclic group, and mixtures thereof; Ar$^4$ is selected from the group consisting of Ar$^1$ (OH)$_2$ and Ar$^2$, x is from about 10 to about 1000; y is from 0 to about 900; D is selected from the group consisting of one of the following moieties:

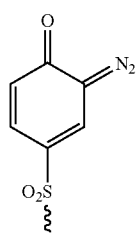

D-1

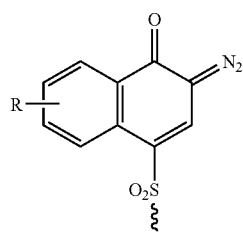

D-2

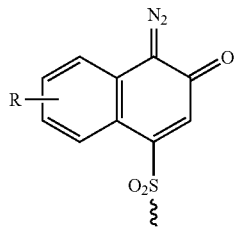

D-3

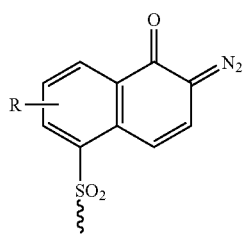

D-4

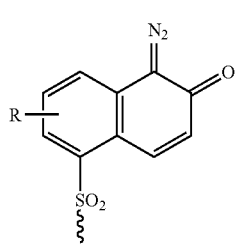

D-5 wherein, R is selected from the group consisting of H, halogen, a $C_1$-$C_4$ alkyl group, a $C_1$-$C_4$ alkoxy group, cyclopentyl, and cyclohexyl; $k^1$ is any positive value of up to about 0.5, $k^2$ is any value from about 1.5 to about 2 with the proviso that $(k^1+k^2)=2$, G is a monovalent organic group having a carbonyl, carbonyloxy or sulfonyl group, G* is a divalent organic group having at least one carbonyl or sulfonyl group; $Ar^7$ is a bivalent to octavalent organic group with at least two carbon atoms, $Ar^8$ is a bivalent to hexavalent organic group with at least two carbon atoms, and $R^4$ selected from the group consisting of hydrogen and an organic group with 1 to 10 carbons, $m^1$ and $m^3$ are integers in the range of 0 to 4 but $m^1$ and $m^3$ cannot be simultaneously 0 and $m^2$ is an integer in the range of 0 to 2.

10. A process according to claim 2 wherein the at least one polybenzoxazole precursor polymer is a positive working composition comprising a polybenzoxazole precursor polymer that does contain at least one acid labile functional group and is selected from the group consisting of polybenzoxazole precursor polymer having Structure Structures VII and VII* where B is an acid labile group which reacts to unmask a phenolic group and wherein $k^1$ is any number between 0.1 and 2, $k^2$ is any number between 0-1.9 provided that $(k^1+k^2)=2$, 11. The process of claim 10 wherein B is selected from the group consisting of

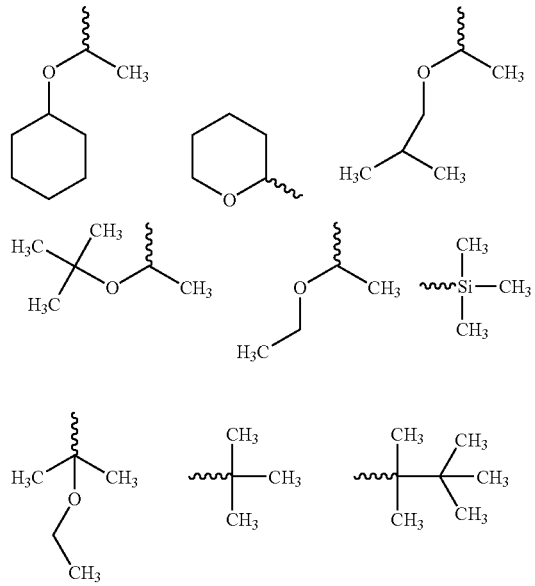

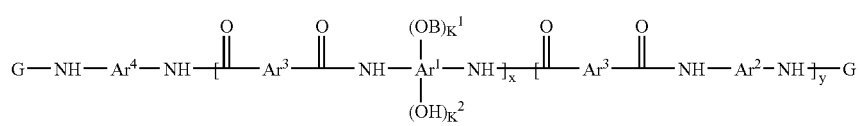

VII

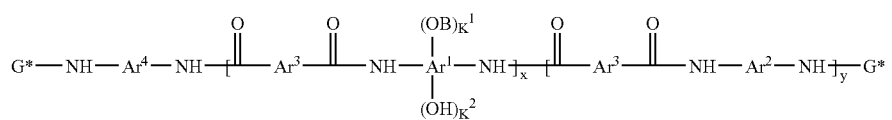

VII* wherein $Ar^1$ is selected from the group consisting of a tetravalent aromatic group, a tetravalent heterocyclic group, and mixtures thereof; $Ar^2$ is selected from the group consisting of a divalent aromatic, a divalent heterocyclic, a divalent alicyclic, and a divalent aliphatic group which may contain silicon; $Ar^3$ is selected from the group consisting of a divalent aromatic group, a divalent aliphatic group, a divalent heterocyclic group, and mixtures thereof; $Ar^4$ is selected from the group consisting of $Ar^1$ $(OH)_2$ and $Ar^2$, x is from about 10 to about 1000; y is from 0 to about 900; G is a monovalent organic group having a carbonyl, carbonyloxy or sulfonyl group, G* is a divalent organic group having at least one carbonyl or sulfonyl group.

-continued

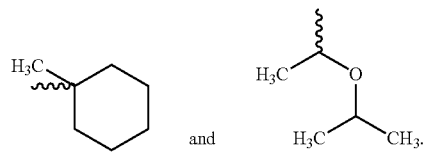

and

12. A process according to claim 2 wherein the at least one polybenzoxazole precursor polymer is a negative working composition comprising a polybenzoxazole precursor polymer of Structure I, III or III*

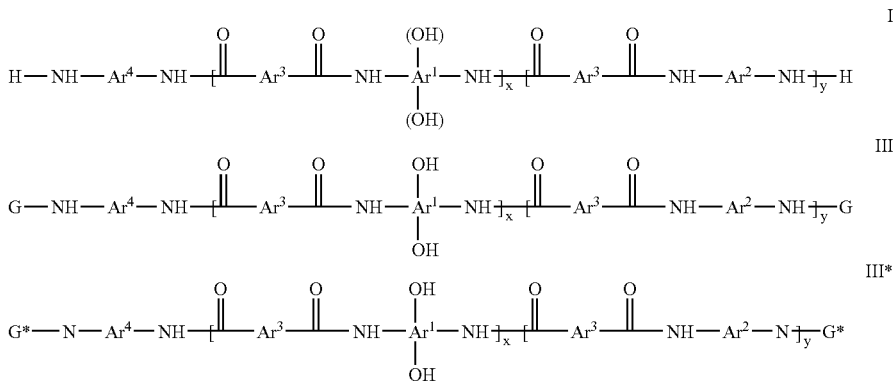

wherein $Ar^1$ is selected from the group consisting of a tetravalent aromatic group, a tetravalent heterocyclic group, and mixtures thereof; $Ar^2$ is selected from the group consisting of a divalent aromatic, a divalent heterocyclic, a divalent alicyclic, and a divalent aliphatic group which may contain silicon; $Ar^3$ is selected from the group consisting of a divalent aromatic group, a divalent aliphatic group, a divalent heterocyclic group, and mixtures thereof; $Ar^4$ is selected from the group consisting of $Ar^1(OH)_2$ and $Ar^2$, x is from about 10 to about 1000; y is from 0 to about 900; G is a monovalent organic group having a carbonyl, carbonyloxy or sulfonyl group, G* is a divalent organic group having at least one carbonyl or sulfonyl group; the photoactive compound that releases acid upon radiation is selected from the group consisting of oxime sulfonates, triazides, diazoquinone sulfonates, and sulfonium or iodonium salts of sulfonic acids, and the latent crosslinker contains at least two $-N-(CH_2-OR^{25})_a$ units wherein $R^{25}$ is an alkyl group of from 1 to 4 carbon atoms and $a$ is 1 or 2.

* * * * *

UNITED STATES PATENT AND TRADEMARK OFFICE
CERTIFICATE OF CORRECTION

PATENT NO. : 7,399,572 B2
APPLICATION NO. : 11/445902
DATED : July 15, 2008
INVENTOR(S) : David B. Powell It is certified that error appears in the above-identified patent and that said Letters Patent is hereby corrected as shown below:

Title Page, Column 1 (Abstract) item 57

Line 3, delete "$V^1$—Y—$V^2$VI" and insert -- $V^1$–Y–$V^2$ VI --

Column 65

Lines 33-39 (approx.), delete " 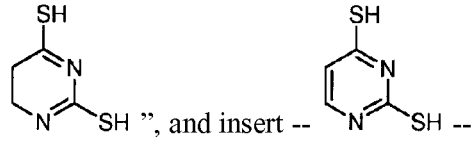 ", and insert --  --

Column 65

Lines 50-56 (approx.), delete " 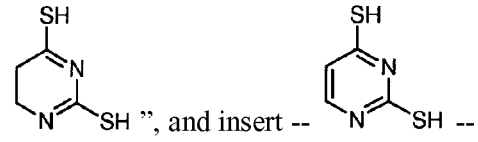 ", and insert --  --

Column 66

Lines 33-35 (approx.), after " 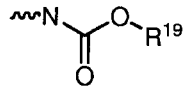 " delete "." and insert -- , --

Column 67
Line 37, delete "heterocycic," and insert -- heterocyclic, --

UNITED STATES PATENT AND TRADEMARK OFFICE
CERTIFICATE OF CORRECTION

PATENT NO.        : 7,399,572 B2
APPLICATION NO.   : 11/445902
DATED             : July 15, 2008
INVENTOR(S)       : David B. Powell It is certified that error appears in the above-identified patent and that said Letters Patent is hereby corrected as shown below:

<u>Column 69</u>
Line 24, after "having" delete "Structure"

Signed and Sealed this

Twenty-eighth Day of October, 2008

JON W. DUDAS
*Director of the United States Patent and Trademark Office*